(12) United States Patent
Takeoka et al.

(10) Patent No.: US 7,453,106 B2
(45) Date of Patent: Nov. 18, 2008

(54) SEMICONDUCTOR DEVICE WITH STRESS REDUCING TRENCH FILL CONTAINING SEMICONDUCTOR MICROPARTICLES IN SHALLOW TRENCH ISOLATION

(75) Inventors: Shinji Takeoka, Osaka (JP); Junji Hirase, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/545,424

(22) Filed: Oct. 11, 2006

(65) Prior Publication Data

US 2007/0105336 A1    May 10, 2007

(30) Foreign Application Priority Data

Nov. 10, 2005    (JP) .............................. 2005-325999

(51) Int. Cl.
*H01L 29/80* (2006.01)
*H01L 21/76* (2006.01)

(52) U.S. Cl. ........................ 257/262; 257/314; 257/324; 257/E29.066; 257/E29.162; 365/185.05; 365/185.17

(58) Field of Classification Search ................. 438/424; 257/262, E29.066, E29.162
See application file for complete search history.

(56) References Cited

U.S. PATENT DOCUMENTS 6,653,200 B2* 11/2003 Olsen ......................... 438/424
2006/0050559 A1* 3/2006 Sakui et al. ............. 365/185.17

FOREIGN PATENT DOCUMENTS

JP        2004-530304        9/2004
WO       WO 02/095818 A1     11/2002

OTHER PUBLICATIONS

V. Chan et al., "High Speed 45nm Gate Length CMOSFETs Integrated Into a 90 nm Bulk Technology Incorporating Strain Engineering"IEDM Tech. Dig. pp. 77-80 (2003).

* cited by examiner

*Primary Examiner*—Matthew S. Smith
*Assistant Examiner*—Walter H Swanson
(74) *Attorney, Agent, or Firm*—McDermott Will & Emery LLP

(57) ABSTRACT

A semiconductor device includes: a semiconductor substrate formed with an active region and an isolation region and having a trench formed in the isolation region; an isolation insulating film embedded in the trench of the semiconductor substrate; and semiconductor nanocrystals buried in the isolation insulating film. The coefficient of linear expansion of the semiconductor nanocrystal is closer to that of the semiconductor substrate rather than that of the isolation insulating film, so that stress applied to the active region after a thermal treatment or the like is reduced.

19 Claims, 14 Drawing Sheets

EXEMPLARY REGION REQUIRING REDUCTION IN FINGER LENGTH DEPENDENCE
NMOS: 0.3 μm OR LESS
PMOS: 0.4 μm OR LESS

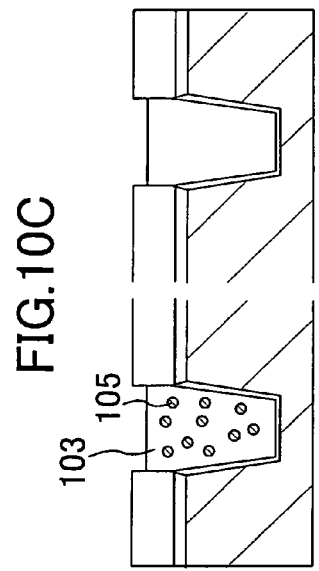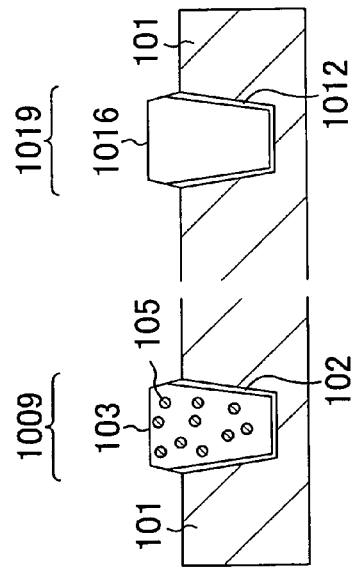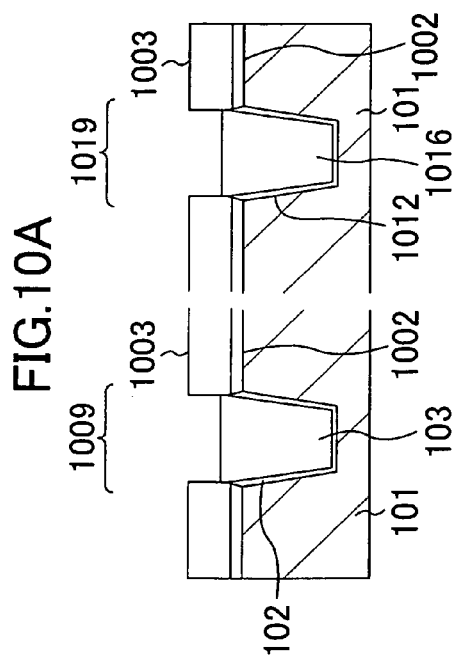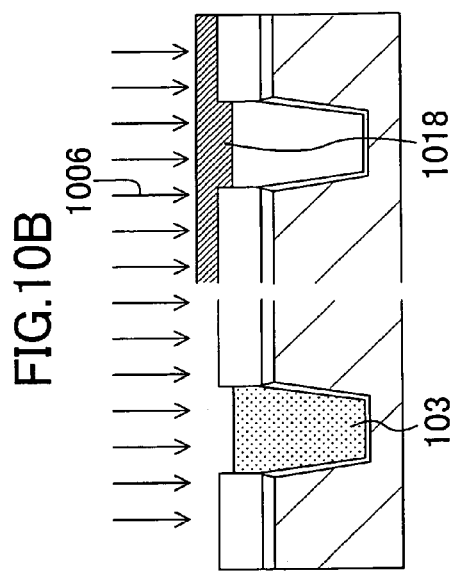

SEMICONDUCTOR DEVICE WITH STRESS REDUCING TRENCH FILL CONTAINING SEMICONDUCTOR MICROPARTICLES IN SHALLOW TRENCH ISOLATION

BACKGROUND OF THE INVENTION (a) Fields of the Invention

The present invention relates to a transistor structure of a field effect transistor having a shallow trench isolation (STI), which can reduce stress applied from an STI portion to a channel region positioned below a gate electrode, and to its fabrication method.

(b) Description of Related Art

As the design rule of semiconductor devices shrinks, circuit integration therein increases dramatically to enable mounting of more than a hundred million field effect transistors on one chip. In order to fabricate such a chip, not only advancement of ultrafine processing technologies such as photolithography and etching requiring the processing accuracy of the order of several tens of nanometers, but also development of technologies for reducing variations in characteristics of individual transistors becomes an important challenge.

One of factors in variation in transistor characteristics includes stress applied from a shallow trench isolation (STI) portion to a channel region positioned below a gate electrode.

FIGS. 15A to 15F are sectional views showing a conventional STI formation flow. In the conventional formation method, as shown in FIG. 15A, first, a sacrificial oxide film 1502 and a mask nitride film 1503 are sequentially deposited on a silicon substrate 1501. Then, as shown in FIG. 15B, a photoresist 1504 is formed on the mask nitride film 1503, and the formed photoresist 1504 is patterned. Subsequently, as shown in FIG. 15C, using the photoresist 1504 as a mask, the mask nitride film 1503, the sacrificial oxide film 1502, and the silicon substrate 1501 are etched to form a trench 1505 with a predetermined depth. Next, as shown in FIG. 15D, after removal of the photoresist 1504, an inner wall of the trench 1505 is subjected to a thermal treatment at 1100° C. in an oxygen gas atmosphere. Thereby, the corner (upper edge) of the trench 1505 is rounded and simultaneously a side wall oxide film 1506 with a thickness of 10 nm is formed on the inner wall of the trench 1505. Next, an embedded oxide film 1507 filling the trench 1505 is deposited on the mask nitride film 1503. As shown in FIG. 15E, the embedded oxide film 1507 is polished by a chemical mechanical polishing (CMP) method, and then the upper portion of the embedded oxide film 1507 is removed by wet etching to adjust the amount of protrusion of the STI portion. As shown in FIG. 15F, finally, the mask nitride film 1503 and the sacrificial oxide film 1502 are removed to form an STI portion.

FIG. 16A is a schematic diagram showing cross-sectional structures of a MOS transistor and an STI portion. Table 1 shows the coefficients of linear expansion of semiconductor materials.

TABLE 1

| Material | Coefficient of Linear Expansion [/° C.] |
|---|---|
| SiO$_2$ | 5.0E−07 |
| Si | 2.6E−06 |
| Ge | 5.8E−06 |

Referring to Table 1, the coefficient of linear expansion of silicon is about five times as great as that of silicon dioxide. Therefore, in the case where a silicon substrate 1601 is used as a substrate, for a period of time during which the temperature of a thermal treatment and the like in process changes from a thermal equilibrium state at a maximum temperature down to room temperature, compressive stress is being applied from an embedded oxide film 1606 of the STI portion to a channel region of the silicon substrate 1601 underlying a gate electrode 1602 (gate insulating film 1604).

FIG. 16B is a graph schematically showing the relation between the variation rate of driving current and the finger length 1605 obtained from the MOS transistor with a gate electrode length fixed. Note that in this specification, the term "finger length" indicates the distance in the direction of the gate length from the edge of the gate electrode to the edge of the STI portion. As can be seen from FIG. 16B, as the finger length 1605 decreases, the driving current of a p-channel transistor increases while the driving current of an n-channel transistor decreases. It is known that stress applied to a channel region changes carrier mobility in a transistor. To be more specific, workings of compressive stress on the channel region increase the mobility in the p-channel transistor and decrease the mobility in the n-channel transistor. On the other hand, workings of tensile stress thereon decrease the mobility in the p-channel MOS transistor and increase the mobility in the n-channel MOS transistor. According to data reported in the document (V. Chan et al., IEDM Tech. Dig. pp. 77-80 (2003).), decreasing the finger length from 1.2 μm to 0.2 μm increases the driving current of the p-channel MOS transistor by 23% and decreases the driving current of the n-channel MOS transistor by about 9%.

The change in driving current due to stress also depends on gate length. FIG. 16C is a graph schematically showing the relation between the variation rate of driving current and the gate length obtained from the MOS transistor with a finger length fixed. As shown in FIG. 16C, a transistor with a certain finger length has a gate size with a maximum variation rate of driving current. According to data reported in the document (V. Chan et al., IEDM Tech. Dig. pp. 77-80 (2003).), in the case of a finger length of 0.2 μm, a transistor with a gate length of 240 nm exhibits a maximum variation rate of driving current, and a decrease in gate length reduces variation in driving current.

As an approach to reducing stress applied from the STI portion to the channel region, Published Japanese translation of a PCT application No. 2004-530304 proposes formation of a buffer layer of a silicon oxynitride film at a boundary region between a silicon substrate and an embedded oxide film. U.S. Pat. No. 6,653,200 proposes use of thermal expansion coefficient of an embedded insulating film identical to that of a silicon substrate. This patent also proposes, as a trench-filling insulating film, a mixture of Al$_2$O$_3$ (25%)-SiO$_2$ (75%) and a mixture of ZrO$_2$ (30%)-SiO$_2$ (70%).

SUMMARY OF THE INVENTION

In the approaches reported previously, however, elements such as nitrogen (N), aluminum (Al), zirconium (Zr) are contained in the embedded insulating film. This sometimes causes troubles in which transistor characteristics fluctuates by factors other than stress. For example, as disclosed in Published Japanese translation of a PCT application No. 2004-530304, when N is taken in the embedded insulating film, a thermal treatment in a transistor formation process diffuses the N atoms in the insulating film. If the N atoms are taken in the silicon substrate, positive fixed charges are generated to fluctuate characteristics of a parasitic transistor created at an edge of the STI portion. In particular, for the p-channel MOS transistor, the threshold of a parasitic transistor created at an edge of an impurity diffusion region greatly decreases, and thereby a phenomenon called 'hump' occurs. To cope with this trouble, decreasing the N concentration in the embedded insulating film reduces fluctuation in characteristics of the parasitic transistor, but also weakens the effect of reducing stress that is the original purpose of the approach. As in the case of employing N, if Al or Zr is taken in silicon, fixed charges are generated to fluctuate characteristics of the parasitic transistor.

An object of the present invention is to provide a semiconductor device which can suppress fluctuation in transistor characteristics and concurrently can reduce stress applied from an STI portion to a channel region, and to provide its fabrication method.

To attain the above object, in a semiconductor device according to the present invention which comprises a first isolation region formed in a semiconductor substrate, a first trench surrounding a first active region of the semiconductor substrate and a first insulating film embedded in the first trench are formed in the first isolation region, and the first insulating film contains semiconductor microparticles made of a group IV semiconductor.

The coefficient of linear expansion of a group IV semiconductor is greater than that of the first insulating film made of a silicon oxide film. Therefore, the structure shown above reduces stress applied to the active region of the semiconductor substrate after a thermal treatment. As a result of this, characteristics of a transistor and the like formed on the active region can be made uniform to stabilize its operations. Moreover, even though group IV semiconductors diffuse into the semiconductor substrate, they do not generate fixed charges. Therefore, the operational reliability of the transistor and the like can be further improved.

Exemplary materials forming the semiconductor microparticle include a silicon crystal, a germanium crystal, a silicon germanium crystal, and the like.

This device may be provided with an n-channel MIS transistor formed on the first active region and a p-channel MIS transistor formed on a second active region.

In a method for fabricating a semiconductor device according to the present invention, the insulating film formed in the step (b) includes: a lower insulating film containing the semiconductor microparticles and covering an inner wall of the trench; and an upper insulating film provided on the lower insulating film and filling the trench. The step (b1) includes: the step (b1A) of forming, over the semiconductor substrate, a lower-insulating-film formation film containing the group IV semiconductor; and the step (b1B) of forming, on the lower-insulating-film formation film, an upper-insulating-film formation film filling at least the trench. In the step (b2), the semiconductor microparticles are formed within the lower-insulating-film formation film, and in the step (b3), portions of the lower-insulating-film formation film and the upper-insulating-film formation film are removed to form the lower insulating film and the upper insulating film in the trench.

A semiconductor serving as the material for the semiconductor microparticle may be introduced during formation of the insulating film, or after formation of an embedded insulating film by ion implantation. In the case of employing ion implantation, semiconductor ions can be implanted into any region.

Furthermore, by introducing a p-type impurity such as boron or an n-type impurity such as phosphorus into the embedded insulating film, the flowability of the embedded insulating film can increase to lower the processing temperature for forming semiconductor microparticles.

BRIEF DESCRIPTION OF THE DRAWINGS

FIGS. 10A to 10D are sectional views showing a method for fabricating a semiconductor device according to a ninth embodiment.

DETAILED DESCRIPTION OF THE PREFERRED EMBODIMENTS

Embodiments of the present invention will be described below with reference to the accompanying drawings.

First Embodiment

Figure 1:
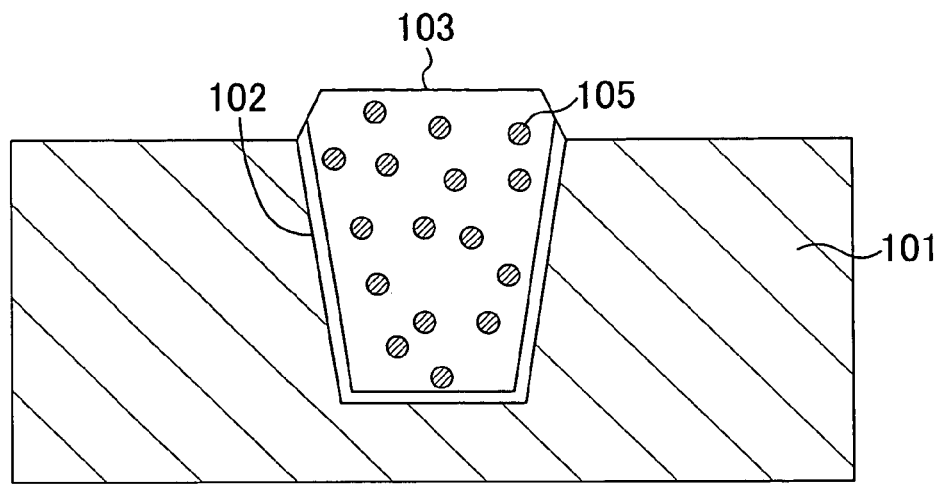
FIG. 1 is a sectional view showing an STI portion (isolation region) of a semiconductor device according to a first embodiment of the present invention.

FIG. 1 is a sectional view showing an STI portion (isolation region) of a semiconductor device according to a first embodiment of the present invention. The semiconductor device of the first embodiment includes: a silicon substrate (semiconductor substrate) 101 formed with an active region and an isolation region surrounding the active region; and a transistor (not shown) such as a MIS transistor provided on the active region of the silicon substrate 101. The isolation region of the silicon substrate 101 is formed with a trench which has a width of about 0.1 μm and a depth of about 0.2 μm and of which an inner wall is covered with a side wall oxide film 102. The inside of this trench is filled with an insulating film 103 for isolation (an isolation insulating film 103) made of silicon oxide, and silicon nanocrystals (semiconductor microparticles) 105 with a diameter of about 5 nm are buried in the isolation insulating film 103.

In the first embodiment, the volume filling factor of the silicon nanocrystals 105 within the isolation insulating film 103 is 30%, and the distance between the silicon nanocrystals 105 is about 2.0 nm. The reason why the silicon nanocrystals 105 are spaced away from each other is to secure insulation of the film. Note that in the semiconductor device of the first embodiment, the silicon nanocrystals 105 are distributed almost uniformly in the entire isolation insulating film 103.

As can be seen from Table 1, the coefficient of linear expansion of Si is about five times as great as that of $SiO_2$. Thus, as shown above, the silicon nanocrystals 105 can be provided in the isolation insulating film 103 to reduce stress applied from an STI portion to the silicon substrate 101 after a thermal treatment. Therefore, in the semiconductor device of the first embodiment, a greater amount of stress than that in the conventional semiconductor device can be reduced which is applied from the STI portion to a channel region of the transistor.

For example, if the volume filling factor of the silicon nanocrystals 105 is 30% like the semiconductor device of the first embodiment, the entire isolation insulating film 103 containing the silicon nanocrystals 105 and embedded in the trench has a coefficient of linear expansion of $1.1\times10^{-6}/°$ C. This value is about twice as great as that of the case where no silicon nanocrystal 105 is provided, that is, $5.0\times10^{-7}/°$ C. As is apparent from this, stress applied from the STI portion to the channel region of the transistor is reduced greatly, and thereby fluctuation in characteristics of the transistor which results from stress applied from the STI portion can be suppressed in the semiconductor device of the first embodiment. Accordingly, in the semiconductor device of the first embodiment, even if miniaturization of the device advances to decrease the finger length thereof, fluctuation in transistor characteristics thereof can be made sufficiently small.

Moreover, the structure of the STI portion described above also allows an appropriate control of stress applied from the STI portion to the channel by modifying the volume filling factor of the silicon nanocrystals 105. Specifically, in an exemplary case where the diameters of the silicon nanocrystals 105 are made large, the volume filling factor of the silicon nanocrystals 105 can be increased with the distance between the silicon nanocrystals 105 kept at 1.5 nm or more. In another exemplary case where the diameters of the silicon nanocrystals 105 are set at 10 nm, even though the distance between the silicon nanocrystals 105 is set at 2 nm, the volume filling factor of the silicon nanocrystals 105 is about 57%. In this case, stress applied to the channel region of the transistor can be further reduced with insulation of the STI portion secured.

Furthermore, in the semiconductor device of the first embodiment, use of a nanocrystal made of element belonging to the same group as the substrate material eliminates the need to add a substance generating fixed charges, such as N, Al, or Zr, into the isolation insulating film 103. This in turn prevents fluctuation in transistor characteristics resulting from the fixed charges.

In the first embodiment, the volume filling factor of the silicon nanocrystals 105 is set at 30%. However, it is not limited to this value, and as described above, it may be changed according to the amount of stress control. In this change, increasing the volume filling factor of the silicon nanocrystals 105 can reduce stress applied to the channel region of the transistor, but in order to secure insulation of the film, the lower limit of the distance between the silicon nanocrystals 105 is desirably set at about 1.5 nm or more. Only if the distance between the silicon nanocrystals 105 is secured, the diameter of the silicon nanocrystal 105 is not limited particularly to the upper limit.

Modification of the First Embodiment

In the semiconductor device of the first embodiment shown in FIG. 1, instead of the silicon nanocrystals 105, germanium nanocrystals having a diameter of 5 nm or nanocrystals such as silicon germanium nanocrystals having a diameter of 5 nm and made of a congener of silicon may be provided within the isolation insulating film 103. Also in this case, the volume filling factor of the germanium nanocrystals or the silicon germanium nanocrystals within the isolation insulating film 103 is 30%.

As described above, even though germanium or silicon-germanium mixed crystal is employed for the material constituting the silicon nanocrystal 105, stress applied from the STI portion to the channel region can be reduced without causing fluctuation in transistor characteristics resulting from fixed charges.

If the volume filling factor of the germanium nanocrystals is 30%, the entire isolation insulating film has a coefficient of linear expansion of $2.1\times10^{-6}/°$ C. This value is about four times as great as that of the case of a silicon oxide film only ($5.0\times10^{-7}/°$ C.), and closer to that of the silicon substrate ($2.6\times10^{-6}/°$ C.) than that of the semiconductor device of the first embodiment. Germanium with a greater coefficient of linear expansion than silicon can be employed for a nanocrystal material to exert a stress reduction effect identical to the case of employing silicon nanocrystals even though the volume filling factor thereof is made lower than the case of employing silicon nanocrystals.

On the other hand, if silicon germanium nanocrystals with a Si:Ge ratio of 1:1 have a volume filling factor of 30%, the entire isolation insulating film has a coefficient of linear expansion of $1.6\times10^{-6}/°$ C. This value is about three times as great as that of the case of a silicon oxide film only ($5.0\times10^{-7}/°$ C.), and closer to that of the silicon substrate ($2.6\times10^{-6}/°$ C.) than that of the semiconductor device of the first embodiment. Silicon germanium with a greater coefficient of linear expansion than silicon can be employed for a nanocrystal material to exert a stress reduction effect identical to the case of employing silicon nanocrystals even though the volume filling factor thereof is made lower than the case of employing silicon nanocrystals. Moreover, since silicon germanium is composed of a mixed crystal with a complete solid solubility, its composition can be changed freely. Therefore, change in composition thereof can also regulate the amount of stress reduction to provide an easier control of the amount of stress reduction.

Moreover, since both of a germanium crystal and a silicon germanium crystal are made of group IV element to which silicon also belongs, no fixed charge is generated.

Even in the case of employing a germanium nanocrystal or a silicon germanium crystal, the diameter of the nanocrystal is not limited to 5 nm.

Second Embodiment

Figure 2:
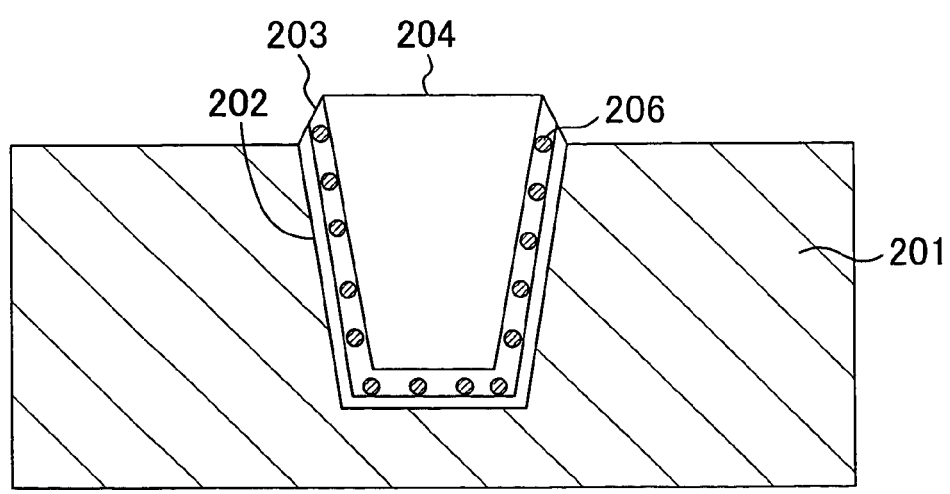
FIG. 2 is a sectional view showing an STI portion of a semiconductor device according to a second embodiment of the present invention.

FIG. 2 is a sectional view showing an STI portion of a semiconductor device according to a second embodiment of the present invention.

In the semiconductor device of the first embodiment, the silicon nanocrystals 105 (see FIG. 1) disperse uniformly in the entire isolation insulating film 103. On the other hand, in the semiconductor device of the second embodiment, silicon nanocrystals 206 are provided only within a liner layer (first insulating film) 203 of silicon oxide having a thickness of about 20 nm and covering a side wall oxide film 202 inside a trench. The lower limit of the distance between the silicon nanocrystals 206 is set at about 1.5 nm or more. The isolation insulating film (second insulating film) 204 of silicon oxide formed on the liner layer 203 fills the trench formed in the silicon substrate 201. Note that the trench formed in the STI portion has a width of, for example, about 0.1 μm, and the isolation insulating film 204 has a width of about 0.04 μm. The width of the isolation insulating film 204 is, for example, about twice the thickness of the liner layer 203. The silicon nanocrystals 206 have a diameter of, for example, 5 nm, and in this case, the volume filling factor of the silicon nanocrystals 206 within the liner layer 203 is about 30%.

With the semiconductor device of the second embodiment, the silicon nanocrystals 206 provided within the liner layer 203 allows more reduction of stress applied from the STI portion to a channel region of a transistor than the conventional semiconductor device.

For example, in the case like the semiconductor device of the second embodiment where the volume filling factor of the silicon nanocrystals is 30% and the volume ratio of the liner layer to the entire embedded oxide film (the total of the liner layer 203 and the isolation insulating film 204) is 50%, the entire embedded oxide film embedded in the trench has a coefficient of linear expansion of $8.1 \times 10^{-7}/°C$. This value is greater than the coefficient of linear expansion of the case where no silicon nanocrystal is provided, that is, $5.0 \times 10^{-7}/°C$.

With the semiconductor device of the second embodiment, stress applied from the isolation region to the channel region of the transistor can be controlled by modifying the volume filling factor of the silicon nanocrystals 206 within the liner layer 203 or by modifying the thickness of the liner layer 203.

Moreover, with the semiconductor device of the second embodiment, use of a nanocrystal made of element belonging to the same group as the substrate material eliminates the need to add a substance generating fixed charges, such as N, Al, or Zr, into the isolation insulating film 204 and the liner layer 203. This in turn prevents fluctuation in transistor characteristics resulting from the fixed charges.

Furthermore, an increase in the dielectric constant of the entire embedded oxide film can be suppressed, so that degradation in the isolation breakdown voltage of the STI portion can be suppressed. Therefore, the ratio of the liner layer 203 provided with the silicon nanocrystals 206 to the entire embedded oxide film can be controlled to optimize the amount of stress reduction and the isolation breakdown voltage.

In the second embodiment, the volume filling factor of the silicon nanocrystals 206 within the liner layer 203 is set at 30%. However, it is not limited to this value, and as described above, it may be changed according to a desired amount of stress control. In this change, increasing the volume filling factor of the silicon nanocrystals 206 can reduce stress applied to the channel region of the transistor, but in order to secure insulation of the layer, the lower limit of the distance between the silicon nanocrystals 206 is desirably set at about 1.5 nm or more. Only if the distance between the silicon nanocrystals 206 is secured, the diameter of the silicon nanocrystal 206 is not limited particularly to the upper limit.

In the semiconductor device of the second embodiment, the silicon nanocrystals 206 are provided within the liner layer 203. Alternatively, semiconductor nanocrystals made of germanium or silicon germanium may be employed.

Third Embodiment

Figure 3:
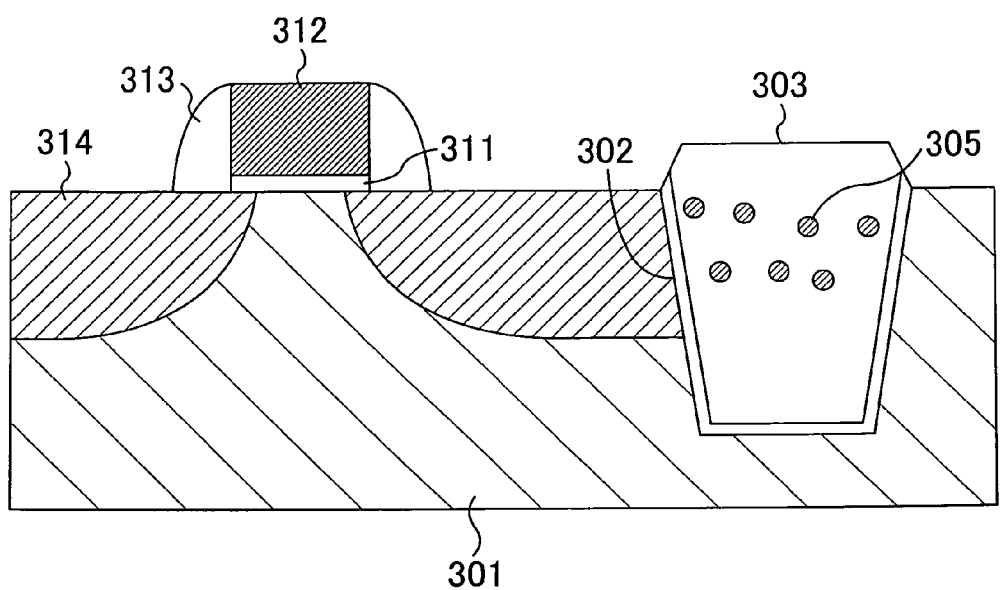
FIG. 3 is a sectional view showing a semiconductor device according to a third embodiment of the present invention.

FIG. 3 is a sectional view showing a semiconductor device according to a third embodiment of the present invention. Referring to FIG. 3, the semiconductor device of the third embodiment includes: a lateral transistor in which carriers flow in the parallel direction to a substrate surface; and an isolation insulating film formed in an isolation region. FIG. 3 shows an exemplary case where a MOS (MIS) transistor is provided as the lateral transistor.

To be more specific, the semiconductor device of the third embodiment includes: a silicon substrate 301 formed with an active region and an isolation region surrounding the active region; and a transistor (not shown) such as a MOS transistor provided on an active region of the silicon substrate 301.

The MOS transistor includes: a gate insulating film 311 of a silicon oxide film or the like provided on a silicon substrate 301; a gate electrode 312 provided on the gate insulating film 311; impurity diffusion regions 314 containing a high concentration of impurities and provided in regions of the silicon substrate 301 located below both side surfaces of the gate electrode 312; and sidewalls 313 provided on the both side surfaces of the gate electrode 312. The MOS transistor may be an n-channel transistor or a p-channel transistor. In this MOS transistor, a channel region where carriers flow is formed in a region of the silicon substrate 301 located below the gate electrode 312 and between the two impurity diffusion regions 314. Each of the impurity diffusion regions 314 is provided in a region of the silicon substrate 301 extending from the top surface thereof to a depth of, for example, about 0.1 μm or less.

On the other hand, the isolation region is formed with a trench whose inner wall is covered with a side wall oxide film 302 and which has a width of about 0.1 μm and a depth of about 0.2 μm. The inside of the trench is filled with an isolation insulating film 303 of silicon oxide, and silicon nanocrystals 305 with a diameter of about 5 nm are buried in the isolation insulating film 303. In the semiconductor device of the third embodiment, when viewed from the side surface of the substrate, the region provided with the silicon nanocrystals 305 has a smaller depth than the depth of the deepest portion of the impurity diffusion region 314. Particularly, for the example described herein, when viewed from a cross-section perpendicular to the substrate surface, the channel region of the MOS transistor and the region provided with the silicon nanocrystals 305 have almost the same level (or depth from the top surface of the substrate).

The volume filling factor of the silicon nanocrystals 305 within the isolation insulating film 303 is 30%, and the distance between the silicon nanocrystals 305 is about 2.0 nm.

With the structure shown above, stress generated laterally from the region formed with the silicon nanocrystals is reduced. The channel region of the MOS transistor is affected by stress most strongly in the entire MOS transistor. Therefore, by forming the region provided with the silicon nanocrystals 305 to have the same level as the channel region provided in the silicon substrate 301, stabilization of characteristics of the MOS transistor associated with stress reduction can be made effectively. Furthermore, a region provided with no silicon nanocrystal 305 is formed within the isolation insulating film 303, whereby an increase in dielectric constant occurring within the isolation region can be suppressed. This prevents degradation in the isolation breakdown voltage of the device.

As described above, silicon nanocrystals belonging to the same group as the substrate material can be provided within the isolation insulating film 303 embedded in the trench to prevent fluctuation in transistor characteristics resulting from fixed charges and also fluctuation in transistor characteristics resulting from stress. Moreover, the region with the silicon nanocrystals existing therein and the channel region can be formed to have the same level to effectively exert the effect of stress reduction.

In the semiconductor device of the third embodiment, when viewed from the side of the substrate, the channel region of the MOS transistor and the region provided with the silicon nanocrystals 305 have almost the same level (or depth from the top surface of the substrate). However, as long as at least part of the region formed with the silicon nanocrystals 305 has the same level as the channel region, the above-mentioned effect of stress reduction can be exerted.

In the third embodiment, the volume filling factor of the silicon nanocrystals 305 is set at 30%. However, it is not limited to this value, and as described above, it may be changed according to the amount of stress control. In this change, increasing the volume filling factor of the silicon nanocrystals 305 can reduce stress applied to the channel region of the transistor, but in order to secure insulation of the film, the lower limit of the distance between the silicon nanocrystals 305 is desirably set at about 1.5 nm or more. The same applies to semiconductor nanocrystals that will be described in the following embodiments.

In the semiconductor device of the third embodiment, a silicon crystal is employed as the semiconductor nanocrystal. However, the nanocrystal is not limited to this, and a group IV semiconductor crystal such as a germanium crystal or a silicon-germanium mixed crystal, and a mixed crystal of group IV semiconductors may be employed. The same applies to semiconductor nanocrystals that will be described in the following embodiments.

Fourth Embodiment

Figure 4A:
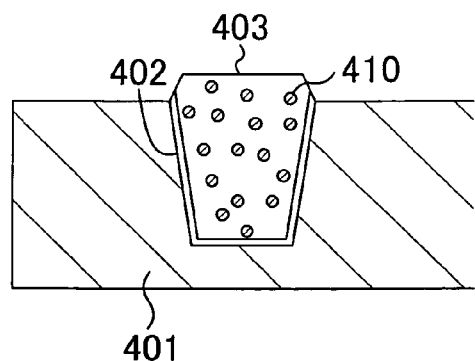
FIGS. 4A and 4B are sectional views showing an STI portion of a semiconductor device according to a fourth embodiment of the present invention.
Figure 4B:
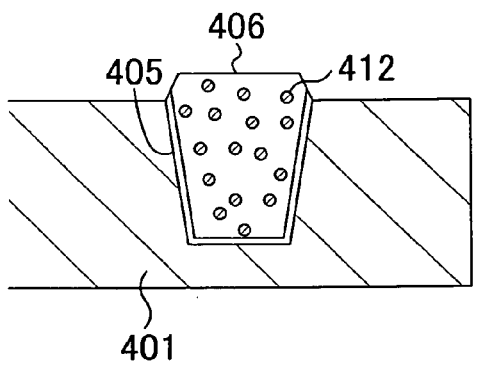
Figure 4C:
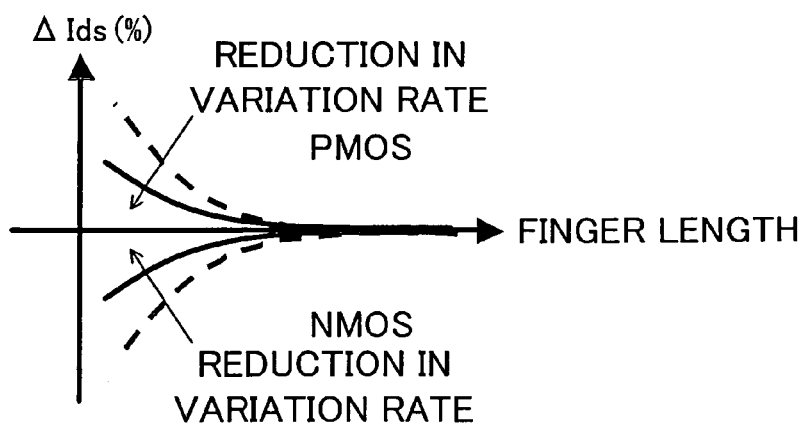
FIG. 4C is a graph schematically showing the relation between the variation rate of driving current and the finger length obtained from a MOS transistor of this device.

FIGS. 4A and 4B are sectional views showing an STI portion of a semiconductor device according to a fourth embodiment of the present invention, and FIG. 4C is a graph schematically showing the relation between the variation rate of driving current and the finger length obtained from a MOS transistor of the semiconductor device of the fourth embodiment. FIG. 4A illustrates an isolation region surrounding an NMOS (NMIS) formation region to be formed with an n-channel MOS transistor, and FIG. 4B illustrates an isolation region surrounding a PMOS (PMIS) formation region to be formed with a p-channel MOS transistor. In FIG. 4C, ΔIds indicates the variation rate of a drain current of the MOS transistor to a drain current of a MOS transistor with the finger length set infinitely great. In a region of the graph where ΔIds is zero or more, the solid curve represents the characteristics of the p-channel MOS transistor in the case where the structure described in the first embodiment is employed for the isolation region surrounding the PMOS formation region, and the broken curve represents the characteristics of the p-channel MOS transistor in the case where no semiconductor nanocrystal made of silicon or the like is provided in the isolation region. In a region of the graph where ΔIds is zero or less, the solid curve represents the characteristics of the n-channel MOS transistor in the case where the structure described in the first embodiment is employed for the isolation region surrounding the NMOS formation region, and the broken curve represents the characteristics of the n-channel MOS transistor in the case where no semiconductor nanocrystal is provided in the isolation region.

The semiconductor device of the fourth embodiment includes: a silicon substrate 401 formed with an active region and an isolation region surrounding the active region; an n-channel MOS transistor (not shown) provided on one active region of the silicon substrate; and a p-channel MOS transistor (not shown) provided on the other active region.

The semiconductor device of the fourth embodiment is characterized in that an isolation insulating film with semiconductor nanoparticles such as silicon nanocrystals formed in the inside is provided in either one of the isolation region surrounding the NMOS formation region and the isolation region surrounding the PMOS formation region.

The isolation region shown in FIG. 4A is formed with: a side wall oxide film 402 covering an inner wall of a trench formed in the silicon substrate 401; an isolation insulating film 403 filling the trench; and semiconductor nanocrystals 410 having a diameter of about 5 nm and buried in the isolation insulating film 403. The volume filling factor of the semiconductor nanocrystals 410 within the isolation insulating film 403 is 30%, and the distance between the semiconductor nanocrystals 410 is about 2.0 μm. In this case, no semiconductor nanocrystal is provided in the isolation region surrounding the PMOS formation region.

With this structure, only in the n-channel MOS transistor, stress can be reduced which is applied from the isolation region to a channel. As can be seen from the characteristic plot in FIG. 4C, when compressive stress is applied to the channel region of the n-channel MOS transistor, the driving current thereof is decreased. Therefore, the structure shown above can be employed to reduce compressive stress applied to the channel region of the n-channel MOS transistor after a thermal treatment, and to improve the driving current of the n-channel MOS transistor in a region of the graph where the finger length is small. Moreover, electrical properties of the n-channel MOS transistor can be stabilized.

On the other hand, as shown in FIG. 4B, the semiconductor nanocrystals may be provided only in the isolation region surrounding the PMOS formation region. In this case, the semiconductor device is formed with: a side wall oxide film 405 covering an inner wall of a trench formed in the silicon substrate 401; an isolation insulating film 406 filling the trench; and semiconductor nanocrystals 412 having a diameter of about 5 nm and buried in the isolation insulating film 406.

As can be seem from FIG. 4C, the driving current of the p-channel MOS transistor increases with decreasing finger length. Therefore, the structure shown above can be employed to reduce compressive stress applied to the channel region of the p-channel MOS transistor after a thermal treatment, which stabilizes the driving current of the p-channel MOS transistor. As a result of this, at the circuit design phase, the accuracy of simulation of transistor characteristics can be improved, so that circuit design of the device can be made more easily than the conventional device.

Fifth Embodiment

Figure 5A:
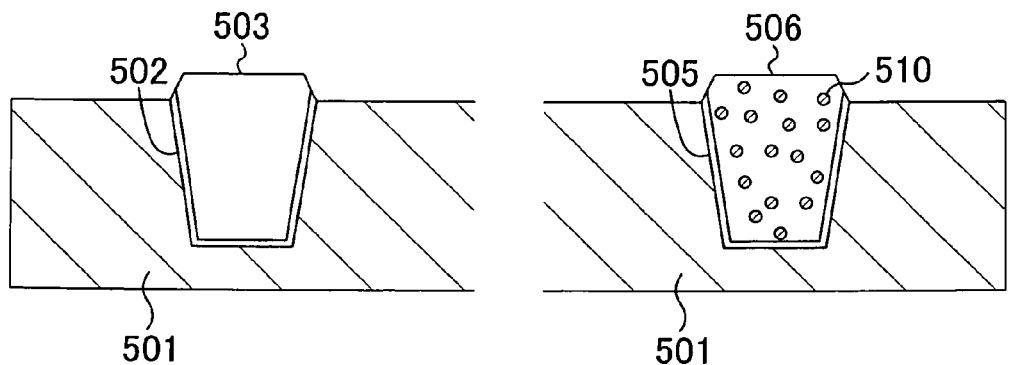
FIG. 5A is a sectional view showing a semiconductor device according to a fifth embodiment of the present invention.
Figure 5B:
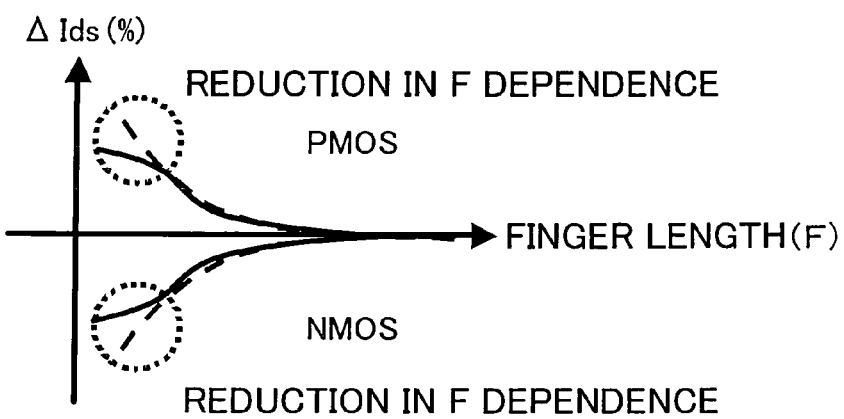
FIG. 5B is a graph schematically showing the relation between the variation rate of driving current and the finger length obtained from a MOS transistor of this device.
Figure 6:
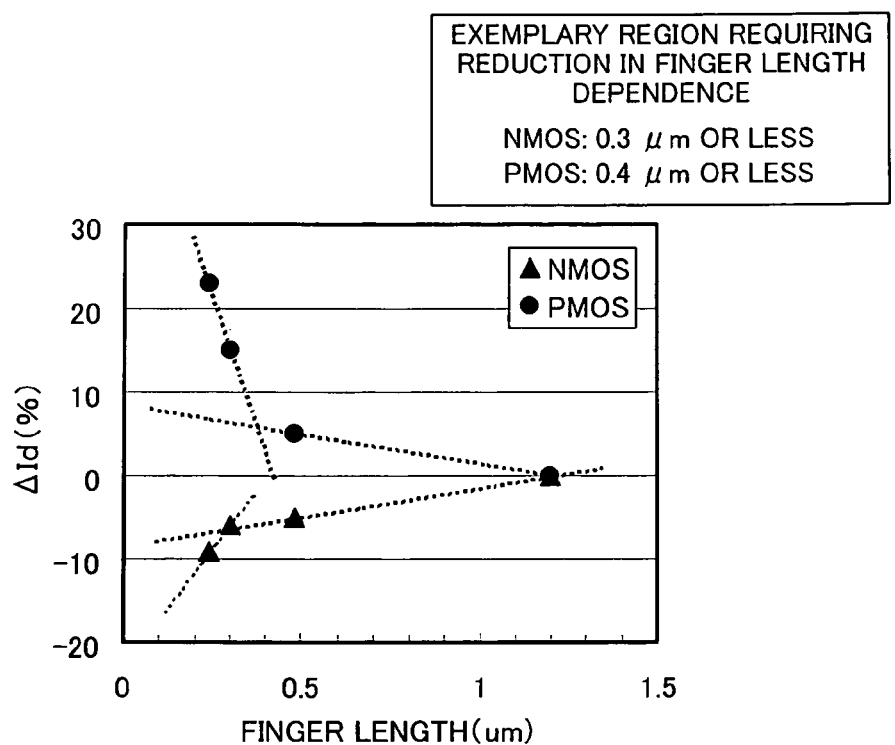
FIG. 6 is a graph showing actually measured values of the relation between the variation rate of driving current and the finger length obtained from a MOS transistor of a general semiconductor device in the case where a gate electrode is fixed.

FIG. 5A is a sectional view showing a semiconductor device according to a fifth embodiment of the present invention, and FIG. 5B is a graph schematically showing the relation between the variation rate of driving current and the finger length obtained from a MOS transistor of the semiconductor device of the fifth embodiment. FIG. 6 is a graph showing actually measured values of the relation between the variation rate of driving current and the finger length obtained from a MOS transistor of a general semiconductor device in the case where a gate electrode is fixed. This data is described in Document (V. Chan et al., IEDM Tech. Dig. pp. 77-80 (2003).), and obtained in the case where the gate length is 45 nm. In FIG. 5B, the solid curve represents the characteristics of the MOS transistor of the semiconductor device of the fifth embodiment, and the broken curve represents the characteristics of the MOS transistor of the conventional semiconductor device.

Referring to FIG. 5A, the semiconductor device of the fifth embodiment is designed so that of isolation regions surrounding MOS transistors formed on a silicon substrate, only those surrounding transistors having finger lengths of a predetermined value or smaller have semiconductor nanocrystals provided therewithin, respectively. To be more specific, from experimental results that will be shown later, of isolation regions 506 surrounding MOS transistors formed on a silicon substrate 501, those surrounding n-channel MOS transistors with finger lengths of 0.3 μm or smaller and those surrounding p-channel MOS transistors with finger lengths of 0.4 μm or smaller have semiconductor nanocrystals 510 provided therewithin as shown on the right side of FIG. 5A. In contrast to this, isolation regions 503 surrounding n-channel MOS transistors with finger lengths beyond 0.3 μm and isolation regions 503 surrounding p-channel MOS transistors with finger lengths beyond 0.4 μm have no semiconductor nanocrystal provided therewithin as shown on the left side of FIG. 5A. Note that the absence of side wall oxide films 502 and 505 has no particular influence on effects of the present invention.

Next description will be made of the reason why criteria to judge the finger length required to reduce stress from the isolation region is set as mentioned above.

As shown in FIG. 6, for a general n-channel MOS transistor, if its finger length is 0.3 μm or smaller, a drain current sharply drops. For a p-channel MOS transistor, if its finger length is 0.4 μm or smaller, the amount of change in drain current sharply rises to lower stabilization of driving current thereof. A similar tendency to this is obtained from a MOS transistor with a different gate width or length.

As is apparent from the above, the isolation insulating film 506 with the semiconductor nanocrystals 510 provided therewithin is formed around the n-channel MOS transistor with a finger length of 0.3 μm or smaller and around the p-channel MOS transistor with a finger length of 0.4 μm or smaller, whereby as shown by the solid curve in FIG. 5B, variations in drain current of the MOS transistor due to its finger length can be decreased to stabilize the electrical properties of the MOS transistor.

The volume filling factor of semiconductor nanocrystals 510 within the isolation insulating film 506 is 30%, and the distance between the semiconductor nanocrystals 510 is 1.5 to 2.0 nm.

Also with the structure shown above, only in the region with a specific finger length, fluctuation in transistor characteristics resulting from stress applied from the isolation region can be reduced.

In the fifth embodiment, the volume filling factor of the semiconductor nanocrystals 510 is set at 30%. However, it is not limited to this value. In this embodiment, increasing the volume filling factor of the semiconductor nanocrystals 510 can reduce stress applied to the channel region of the transistor, but in order to secure insulation of the film, the lower limit of the distance between the semiconductor nanocrystals 510 is desirably set at about 1.5 nm or more.

Sixth Embodiment

Figure 5C:
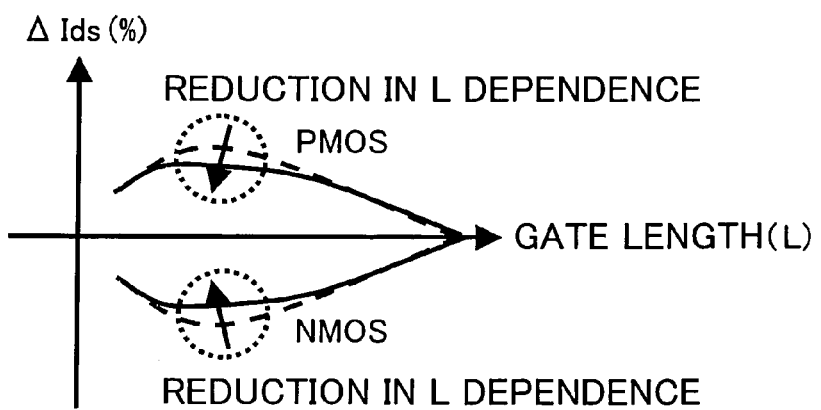
FIG. 5C is a graph schematically showing the relation between the variation rate of driving current and the gate length obtained from a MOS transistor of a semiconductor device according to a sixth embodiment of the present invention.

FIG. 5C is a graph schematically showing the relation between the variation rate of driving current and the gate length obtained from a MOS transistor of a semiconductor device according to a sixth embodiment of the present invention. In FIG. 5C, the solid curve represents the characteristics of the MOS transistor of the semiconductor device according to the sixth embodiment, and the broken curve represents the characteristics of the MOS transistor of the conventional semiconductor device.

The semiconductor device of the sixth embodiment includes: a plurality of MOS transistors provided on active regions in a silicon substrate, respectively; and isolation insulating films provided in isolation regions surrounding the active regions and embedded in trenches, respectively. In this device, semiconductor nanocrystals of a silicon crystal or the like having a diameter of about 5 nm are buried only within an isolation insulating film formed in an isolation region surrounding a MOS transistor having a gate length within a specific range.

As can be seen from the dotted curve in FIG. 5C, for a general p-channel MOS transistor, drain current is maximum when the gate length thereof has a certain value, and the variation amount ΔIds of drain current decreases away from that value. On the other hand, for a general n-channel MOS transistor, drain current is minimum (the variation amount ΔIds of drain current has a maximum absolute value) when the gate length thereof has a certain value, and the variation amount of drain current approaches zero as it is away from that value.

In the semiconductor device of the sixth embodiment, the isolation insulating film with the semiconductor nanocrystals buried therewithin is provided around the MOS transistor which has the gate electrode with a gate length within a predetermined range including a gate length capable of providing a maximum absolute value of variation amount of drain current. This reduces stress applied from the isolation region to the channel region of the MOS transistor which has the gate electrode with a gate length within a predetermined range. As a result of this, as can be seen from the solid curve in FIG. 5C, both of the p-channel and n-channel MOS transistors have decreased drain current variations and stabilized, uniformized electrical characteristics.

In the sixth embodiment, the silicon nanocrystal is employed which has a volume filling factor of 30% and a diameter of 5 nm, but it is not limited to these values. In addition, a silicon nanocrystal is employed as the semiconductor nanocrystal, but the nanocrystal is not limited to this. Alternatively, a germanium nanocrystal or a silicon-germanium nanocrystal may be employed thereas.

Seventh Embodiment

Figure 7:
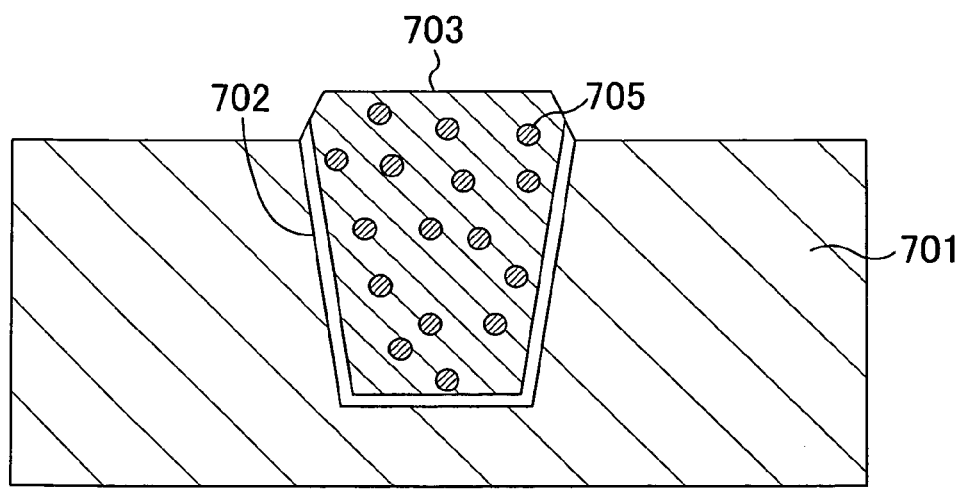
FIG. 7 is a sectional view showing an STI portion of a semiconductor device according to a seventh embodiment of the present invention.

FIG. 7 is a sectional view showing an STI portion of a semiconductor device according to a seventh embodiment of the present invention. The semiconductor device of the seventh embodiment includes: an isolation insulating film containing an n-conductivity type impurity or a p-conductivity type impurity; and semiconductor nanocrystals of a silicon crystal or the like buried within the isolation insulating film.

Referring to FIG. 7, the semiconductor device of the seventh embodiment includes: a silicon substrate 701 formed with an active region; a MOS transistor (not shown) provided on the active region of the silicon substrate 701; a side wall oxide film 702 provided in an isolation region surrounding the active region and covering an inner wall of a trench formed in the silicon substrate 701; an isolation insulating film 703 embedded in the trench and made of a silicon oxide film with boron (B) added therein; and semiconductor nanocrystals 705 of a silicon crystal or the like buried within the isolation insulating film 703. The diameter of the semiconductor nanocrystal 705 is about 5 nm, and the distance between the semiconductor nanocrystals 705 is about 2.0 nm. The volume filling factor of the semiconductor nanocrystals 705 within the isolation insulating film 703 is, for example, 30%.

Boron introduction into the isolation insulating film 703 may be conducted separately by ion implantation or simultaneously by a CVD method carried out for formation of an oxide film. This will be described in a later embodiment.

In the semiconductor device of the seventh embodiment, boron is added into the isolation insulating film 703 to decrease the viscosity of the isolation insulating film 703. This enables provision of semiconductor nanocrystals 705 made of a silicon crystal at a lower temperature than the case where no boron is added thereinto. Therefore, in providing the semiconductor nanocrystals 705, stress can be reduced which is applied from the isolation region to the channel region of the MOS transistor. Moreover, since like the semiconductor device of the previously-described embodiments, formation of the semiconductor nanocrystals 705 also reduces stress applied to the channel region of the MOS transistor, the semiconductor device of the seventh embodiment has significantly stabilized characteristics of the MOS transistor.

Furthermore, by a thermal treatment performed in a transistor formation process, boron in the isolation insulating film 703 can be supplied to the silicon substrate 701. In particular, boron is introduced into the isolation insulating film surrounding the NMOS formation region to raise the threshold of a parasitic transistor formed in a region of a junction between the active region and the isolation region located immediately below the gate electrode (not shown), so that fluctuation in characteristics of the n-channel MOS transistor resulting from this parasitic transistor can be prevented.

First Modification of Seventh Embodiment

In a semiconductor device according to a first modification of the seventh embodiment, not boron but phosphorus is introduced into the isolation insulating film 703 shown in FIG. 7. The other construction of the semiconductor device according to the first modification is the same as the construction of the semiconductor device according to the seventh embodiment.

Since the semiconductor device according to the first modification has phosphorus introduced therein, the viscosity of the isolation insulating film 703 is decreased. Therefore, the semiconductor nanocrystals 705 can be provided at a lower temperature than the case where phosphorus is not introduced. This reduces stress applied from the isolation region to the channel region of the MOS transistor in providing the semiconductor nanocrystals 705.

In particular, phosphorus is introduced into the isolation insulating film surrounding the PMOS formation region to raise the threshold of a parasitic transistor formed in a region of a junction between the active region and the isolation region located immediately below the gate electrode, so that fluctuation in characteristics of the p-channel MOS transistor resulting from this parasitic transistor can be prevented.

Second Modification of Seventh Embodiment

In a semiconductor device according to a second modification of the seventh embodiment, not only boron but also phosphorus is introduced into the isolation insulating film 703 shown in FIG. 7. Since in the semiconductor device according to the second modification, boron and phosphorus are present in the isolation insulating film 703, the viscosity of the isolation insulating film 703 is decreased. Therefore, the semiconductor nanocrystals can be provided at a lower temperature than the case where boron and phosphorus are absent. This reduces stress applied from the isolation region to the channel region of the MOS transistor, and in addition to this, a thermal treatment performed in forming the transistor can supply the silicon substrate 701 with phosphorus and boron contained in the isolation insulating film 703. In this supply, by regulating the proportion between boron and phosphorus (the proportion of the number of atoms therebetween), the threshold of a parasitic transistor can be controlled which is formed in a region of a junction between the active region and the isolation region located immediately below the gate electrode. In order to reduce the influence of the parasitic transistor on the n-channel MOS transistor, it is sufficient to increase the proportion of boron in the isolation insulating film. In order to reduce the influence of the parasitic transistor on the p-channel MOS transistor, it is sufficient to increase the proportion of phosphorus in the isolation insulating film. On the other hand, if no influence is exerted on the parasitic transistor, it is sufficient to set phosphorus and boron to have equal proportions.

Third Modification of Seventh Embodiment

Figure 8A:
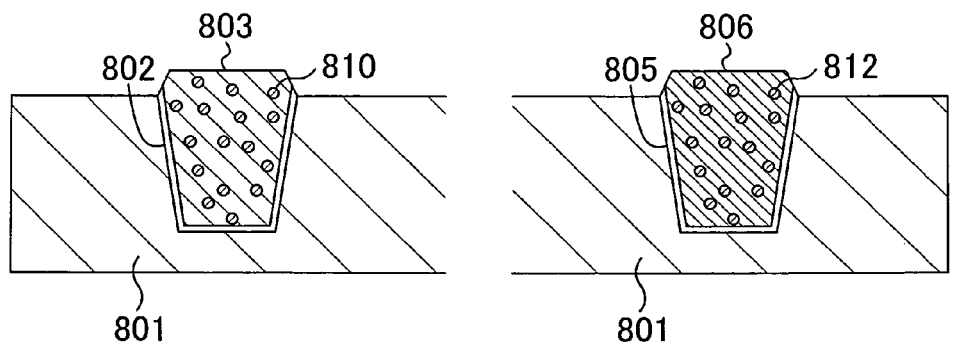
FIG. 8A is a sectional view showing an STI portion of a semiconductor device according to a third modification of the seventh embodiment.
Figure 8B:
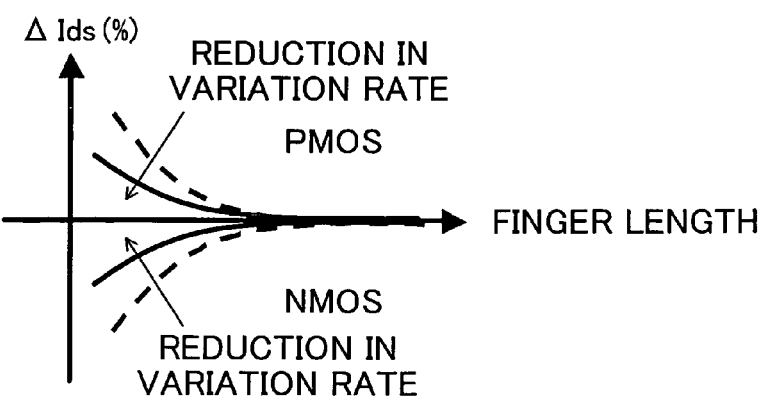
FIG. 8B is a graph schematically showing the relation between the variation rate of driving current and the finger length obtained from a MOS transistor of the semiconductor device of the third modification.

FIG. 8A is a sectional view showing an STI portion of a semiconductor device according to a third modification of the seventh embodiment, and FIG. 8B is a graph schematically showing the relation between the variation rate of driving current and the finger length obtained from a MOS transistor of the semiconductor device of the third modification.

Referring to FIG. 8A, in the semiconductor device of the third modification, boron is introduced into an isolation insulating film 803 surrounding an NMOS formation region, and phosphorus is introduced into an isolation insulating film 806 surrounding a PMOS formation region. The isolation insulating film 803 is provided on a side wall oxide film 802 covering the inside of a trench formed in a silicon substrate 801. The isolation insulating film 806 is provided on a side wall oxide film 805 covering the inside of a trench formed in the silicon substrate 801. Semiconductor nanocrystals 810 are buried in the isolation insulating film 803, and semiconductor nanocrystals 812 are buried in the isolation insulating film 806. The other components of the semiconductor device of the third modification are constructed in the same manner as the semiconductor device of the seventh embodiment.

In the semiconductor device of the third modification, in the NMOS formation region, a thermal treatment diffuses boron contained in the isolation insulating film into the silicon substrate. This raises the threshold of a parasitic transistor formed in a region of a junction between the active region and the isolation region located immediately below the gate electrode, so that fluctuation in characteristics of the n-channel MOS transistor resulting from this parasitic transistor can be prevented. In addition to this, as described above, formation of the semiconductor nanocrystals 810 within the isolation region stabilizes the characteristics of the n-channel MOS transistor as shown in FIG. 8B.

On the other hand, in the PMOS formation region, a thermal treatment diffuses phosphorus contained in the isolation insulating film into the silicon substrate. This raises the threshold of a parasitic transistor formed in a region of a junction between the active region and the isolation region located immediately below the gate electrode, so that fluctuation in characteristics of the p-channel MOS transistor resulting from this parasitic transistor can be prevented. In addition to this, formation of the semiconductor nanocrystals 812 within the isolation region stabilizes the characteristics of the p-channel MOS transistor as shown in FIG. 8B.

In this modification, description has been made of the exemplary case where boron is introduced into the isolation insulating film 803 surrounding the NMOS formation region and phosphorus is introduced into the isolation insulating film 806 surrounding the PMOS formation region. Alternatively, an impurity may be introduced only in the isolation insulating film 803, or only in the isolation insulating film 806.

Eighth Embodiment

FIGS. 9A to 9D are sectional views showing a method for fabricating a semiconductor device according to an eighth embodiment of the present invention. The fabrication method of the eighth embodiment is a method for fabricating the semiconductor device of the first embodiment. The following is to describe process steps of forming a trench isolation structure.

Figure 9A:
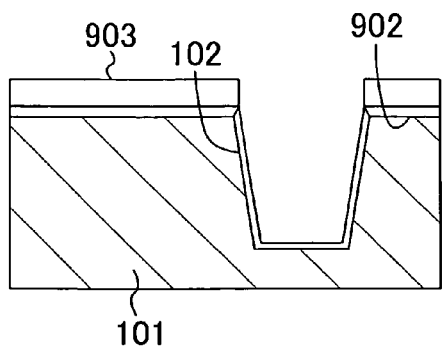
FIGS. 9A to 9D are sectional views showing a method for fabricating a semiconductor device according to an eighth embodiment of the present invention.

In the step shown in FIG. 9A, first, a sacrificial oxide film 902 and a mask nitride film 903 are sequentially deposited on the silicon substrate 101. Photolithography and dry etching are then conducted to form a trench (trench) in the isolation region of the silicon substrate 101. The resulting silicon substrate 101 is subjected to a thermal treatment in an oxygen atmosphere at 1100° C. to round the corner of the trench and simultaneously form the side wall oxide film 102 having a thickness of 10 nm and covering the inner wall of the trench.

Subsequently, in the step shown in FIG. 9B, using a chemical vapor deposition method (CVD method), a silicon oxide film 905 with silicon added therein is deposited over the entire top surface of the substrate. In this step, for example, silane gas and oxygen gas both serving as a source gas are supplied into an reaction chamber on the condition of 0.1 Pa and 450° C. to deposit a silicon oxide film 905 represented by $SiO_x$ (x=1.7) and containing silicon. In the as-deposited state, excess silicon atoms exist in the silicon oxide film 905 in a dispersed state, and they are not crystallized.

Figure 9B:
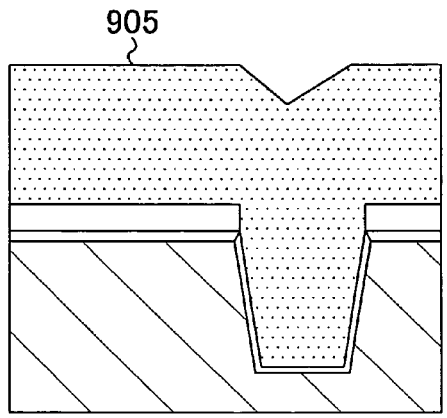
Figure 9C:
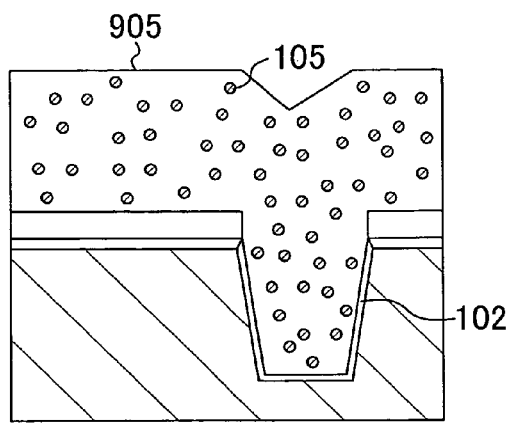

In the step shown in FIG. 9C, the resulting substrate is subjected to a thermal treatment in an inert gas such as argon gas at 1100° C. for 60 minutes. By this treatment, phase separation between silicon and silicon oxide occurs within the silicon oxide film 905 deposited in the previous step, thereby forming the silicon nanocrystals 105 with a diameter of 5 nm.

Figure 9D:
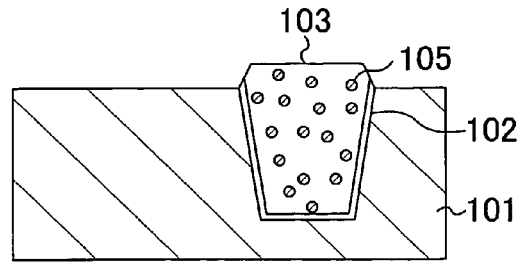

Next, in the step shown in FIG. 9D, using a CMP method, the silicon oxide film 905 is polished to expose the top surface of the mask nitride film 903 to form the isolation insulating film 103 embedded in the trench. Then, wet etching for adjusting an STI protrusion and removal of the mask nitride film 903 and the sacrificial oxide film 902 are conducted, and thereby the isolation region of the semiconductor device of the first embodiment can be formed. Thereafter, by a commonly known method, a semiconductor element such as a MOS transistor is formed on the active region of the silicon substrate 101, whereby the semiconductor device of the first embodiment is completed.

As described above, in the fabrication method of the eighth embodiment, the silicon oxide film containing silicon atoms is deposited over the substrate, and then the thermal treatment is performed thereon. Thereby, the isolation insulating film 103 with the silicon nanocrystals 105 buried therein can be formed easily.

In the method of the eighth embodiment, $SiO_x$ (x=1.7) is employed as the composition of the silicon oxide film 905 deposited in the step shown in FIG. 9B. However, the composition thereof is not limited to this value, and it can be selected within the range of x=2 or less according to a required amount of stress reduction.

In the method of the eighth embodiment, as the silicon concentration in the silicon oxide film 905 deposited in the step shown in FIG. 9B increases, the diameter of the silicon nanocrystal 105 formed in the step shown in FIG. 9C becomes greater. Also, in this embodiment, description has been made of the exemplary case where the thermal treatment temperature for the substrate is set at 1100° C. However, the thermal treatment temperature is not limited to this, and alternatively a temperature at which crystallization can occur can be employed.

Description has been made of the exemplary case where the period of time for the thermal treatment for forming the silicon nanocrystals 105 is 60 minutes. Alternatively, the period of time enough to form the silicon nanocrystals can be employed as the treatment time.

In the eighth embodiment, description has been made of the exemplary case where the thermal treatment for formation of the silicon nanocrystals 105 is performed before the CMP process. Alternatively, the thermal treatment may be performed after the CMP process.

Modification of Eighth Embodiment

A method for forming germanium nanocrystals buried in the isolation insulating film 103 will be described as a first modification of the method for fabricating a semiconductor device according to the eighth embodiment. The following brief description will be focused on different points from the fabrication method of the eighth embodiment.

First, by the same step as the step shown in FIG. 9A, the side wall oxide film covering the inner wall of the trench formed in the silicon substrate, the sacrificial oxide film, and the mask nitride film are formed.

Next, as the step corresponding to FIG. 9B, by a CVD method or the like, silicon oxide film containing germanium is deposited over the entire top surface of the substrate. In this step, for example, silane gas, germane gas, and oxygen gas all serving as a source gas are supplied into the reaction chamber on the condition of 0.1 Pa and 450° C. to deposit a silicon oxide film with germanium with a volume percentage of 30% added therewithin.

Subsequently, as the step corresponding to FIG. 9C, the resulting substrate is subjected to a thermal treatment in an inert gas such as argon gas at 800° C. for 60 minutes. By this treatment, germanium atoms diffuse in the silicon oxide film and simultaneously germanium atoms fuse with each other to form germanium nanocrystals with a diameter of 5 nm. In the case of forming germanium nanocrystals, a thermal treatment for this formation can be performed at a lower temperature than formation of silicon nanocrystals.

Similarly to the step shown in FIG. 9D, using a CMP method, the silicon oxide film is polished to expose the top surface of the mask nitride film to form the isolation insulating film embedded in the trench. Then, wet etching for adjusting an STI protrusion and removal of the mask nitride film and the sacrificial oxide film are conducted, and thereby the isolation region of the semiconductor device can be formed.

As described above, with the fabrication method of this modification, the isolation oxide film can be processed at a lower temperature than formation of a silicon nanocrystal within the isolation insulating film. This reduces stress applied to the silicon substrate after the thermal treatment.

In this modification, the amount of germanium to be added is set at 30% of the volume of the isolation insulating film. However, it is not limited to this amount, and it can be selected according to a required amount of stress reduction. Also, the exemplary condition of 800° C. and 60 minutes is shown as a thermal treatment condition. However, it is sufficient to employ a condition on which germanium nanocrystals can be formed, and the temperature and the thermal treatment time are not limited to these values.

The first modification has described the method for fabricating germanium nanocrystals within the isolation insulating film. Alternatively, as a second modification, the condition of the CVD method or the like can be modified to form silicon germanium nanocrystals within the isolation insulating film.

To be more specific, in the step corresponding to FIG. 9B, for example, silane gas, germane gas, and oxygen gas all serving as a source gas are supplied into the reaction chamber of a CVD apparatus on the condition of 0.1 Pa and 450° C. to deposit, over the silicon substrate, a silicon oxide film with 20% of silicon and 10% of germanium (the ratio of the number of atoms) added therewithin.

Subsequently, as the step corresponding to FIG. 9C, the resulting substrate is subjected to a thermal treatment in an inert gas such as argon gas at, for example, 1050° C. for 60 minutes. By this treatment, silicon atoms and germanium atoms diffuse in the silicon oxide film and simultaneously silicon atoms and germanium atoms fuse with each other and then grow to form silicon germanium nanocrystals with a diameter of 5 nm. In this step, the silicon germanium nanocrystals can be formed by performing a thermal treatment at about 800 to 1100° C. inclusive. Therefore, the semiconductor nanocrystals can be formed at a lower temperature than formation of silicon nanocrystals. In addition, since silicon and germanium are formed into a mixed crystal with a complete solid solubility, the mix ratio of silicon and germanium can be selected freely according to a required amount of stress reduction.

The diameter of silicon germanium nanocrystal is not limited to 5 nm, and a different diameter may be employed according to a required amount of stress reduction. Also, the period of time for the thermal treatment for forming silicon germanium nanocrystals is not limited to 60 minutes as long as the period has a length enough for crystallization.

Ninth Embodiment

Another method for fabricating a semiconductor device according to the first embodiment shown in FIG. 1 will be described as a ninth embodiment of the present invention.

FIGS. 10A to 10D are sectional views showing the method for fabricating a semiconductor device according to the ninth embodiment. These figures illustrate process steps of forming a trench isolation structure. In the views shown in FIGS. 10A to 10D, the isolation region formed with semiconductor nanocrystals is shown on the left side, while the isolation region formed with no semiconductor nanocrystal is shown on the right side.

In the step shown in FIG. 10A, first, a sacrificial oxide film 1002 and a mask nitride film 1003 are sequentially deposited on the silicon substrate 101. Photolithography and dry etching are then conducted to form trenches in a first isolation region 1009 and a second isolation region 1019 of the silicon substrate 101, respectively. The resulting silicon substrate 101 is subjected to a thermal treatment in an oxygen atmosphere at 1100° C. to round the corners of the trenches and simultaneously form side wall oxide films 102 and 1012 having a thickness of 10 nm and covering the inner walls of the trenches, respectively. Subsequently, using a CVD method, a silicon oxide film filling the trenches is formed over the entire top surface of the substrate. Then, using a CMP method, the silicon oxide film is polished to expose the top surface of the mask nitride film 1003 to form isolation insulating films 103 and 1016 of silicon oxide embedded in the trenches, respectively. Thereafter, portions of the isolation insulating films 103 and 1016 are removed by wet etching so that the top surfaces of the isolation insulating films 103 and 1016 are lower in level than the top surface of the mask nitride film 1003.

In the step shown in FIG. 10B, in the state in which a photoresist 1018 covering the second isolation region 1019 and having an opening formed on the first isolation region 1009 is formed over the substrate, Si ions 1006 are implanted into the isolation insulating film 103. In this step, in order to form the entire isolation insulating film 103 to have $SiO_x$ (x=1.7) composition, Si ions are implanted in four steps consisting of acceleration energies of 25 keV, 50 keV, 100 keV, and 150 keV. By implanting Si ions at the condition shown above, the silicon concentration can be made almost uniform in a region of the isolation insulating film 103 extending from the top surface thereof to a depth of about 200 nm or smaller. The photoresist 1018 is then removed.

Next, in the step shown in FIG. 10C, the resulting substrate is subjected to a thermal treatment in an inert gas such as argon gas at 1100° C. for 60 minutes. By this treatment, phase separation between silicon implanted in the previous step and the isolation insulating film 103 occurs to form the silicon nanocrystals 105 with a diameter of about 5 nm dispersed within the isolation insulating film 103.

In the step shown in FIG. 10D, the mask nitride film 1003 and the sacrificial oxide film 1002 are removed to form the isolation region of the semiconductor device of the first embodiment. Thereafter, by a commonly known method, a semiconductor element such as a MOS transistor is formed on the active region of the silicon substrate 101, whereby the semiconductor device of the first embodiment is completed.

As described above, by adding, to the STI formation method, the silicon nanocrystal formation process conducted by the Si ion implantation and the thermal treatment, the isolation insulating film of a silicon oxide film having the silicon nanocrystals buried therein can be formed. With this method, silicon nanocrystals can be provided easily, and in addition, by implanting Si ions into a desired region of the isolation insulating film, silicon nanocrystals can be provided selectively in the desired region.

In the fabrication method of the ninth embodiment, the isolation region to be provided with the semiconductor nanocrystals can be selected freely. For example, with the method of the ninth embodiment, like the semiconductor device according to the fourth embodiment, semiconductor nanocrystals can be formed only either of the isolation region surrounding the NMOS formation region and the isolation region surrounding the PMOS formation region.

In the method of the ninth embodiment, $SiO_x$ (x=1.7) is employed as the composition of the isolation insulating film 103 obtained after the Si ion implantation. However, the composition thereof is not limited to this value, and it can be selected according to a required amount of stress reduction. Also, the acceleration energy of Si ions is not limited to the values listed above, and it can be selected as appropriate according to the depth of the trench.

Modification of Ninth Embodiment

A method for forming germanium nanocrystals buried in the isolation insulating film 103 will be described as a first modification of the method for fabricating a semiconductor device according to the ninth embodiment. The following brief description will be focused on different points from the fabrication method of the ninth embodiment. Hereinafter, attention of the description is directed toward the isolation region to be formed with the semiconductor nanocrystals.

First, by the same step as the step shown in FIG. 10A, the sacrificial oxide film and the mask nitride film are sequentially formed on the silicon substrate, and then the resulting silicon substrate is formed with a trench. The side wall oxide film covering the inner wall of the trench is formed, and then the isolation insulating film embedded in the trench is formed.

Next, in the step corresponding to FIG 10B, Ge ions are implanted into the isolation insulating film. In this step, in order to add germanium into the isolation insulating film by an amount of 30%, Ge ions are implanted in four steps consisting of acceleration energies of 10 keV, 20 keV, 40 keV, and 60 keV. By implanting Ge ions on the condition shown above, the germanium concentration can be made almost uniform in a region of the isolation insulating film extending from the top surface thereof to a depth of about 200 nm or smaller. Note that a mask is formed over the region in which Ge ions are not implanted.

Subsequently, in the step corresponding to FIG. 10C, the resulting substrate is subjected to a thermal treatment in an inert gas such as argon gas at 800° C. for 60 minutes. By this treatment, phase separation between germanium implanted in the previous step and the isolation insulating film occurs to form germanium nanocrystals with a diameter of about 5 nm dispersed within the isolation insulating film.

Similarly to the step shown in FIG. 10D, the mask nitride film and the sacrificial oxide film are removed to form the isolation region of the semiconductor device according to the first modification of the first embodiment.

As described above, also by implanting Ge ions into the isolation insulating film and then performing a thermal treatment, germanium nanocrystals can be formed as in the method in which the silicon oxide film containing germanium is formed and then the thermal treatment is performed. With the method of this modification, Ge ions can be implanted into a desired region of the isolation insulating film to selectively form germanium nanocrystals in the desired region. Moreover, the thermal treatment for forming germanium nanocrystals can be performed at a lower temperature than that of the thermal treatment for forming silicon nanocrystals.

In this modification, the amount of germanium to be added into the isolation insulating film is set at 30%. However, it is not limited to this amount, and it can be selected according to a required amount of stress reduction. Also, the acceleration energy of Ge ions is not limited to the values listed above, and it can be selected freely according to the depth of the trench formed in the silicon substrate.

In the first modification, description has been made of the case where ion implantation is performed to form germanium nanocrystals within the isolation insulating film. Hereinafter, a method of performing ion implantation to form silicon germanium nanocrystals within the isolation insulating film will be described as the second modification.

To be more specific, in the step corresponding to FIG. 10B, Si ions and Ge ions are implanted into the isolation insulating film so that the implanted film has 20% of silicon and 10% of germanium. For example, first, Si ions are implanted in four steps consisting of acceleration energies of 25 keV, 50 keV, 100 keV, and 150 keV. Thereafter, Ge ions are implanted in four steps consisting of acceleration energies of 10 keV, 20 keV, 40 keV, and 60 keV. By implanting Si ions and Ge ions at the condition shown above, each of the silicon and germanium concentrations can be made uniform in a region of the isolation insulating film extending from the top surface thereof to a depth of about 200 nm or smaller.

Next, in the step corresponding to FIG. 10C, the resulting substrate is subjected to a thermal treatment in an inert gas such as argon gas at 1050° C. for 60 minutes. By this treatment, phase separation between silicon and germanium implanted in the previous step and the isolation insulating film occurs to form the silicon germanium nanocrystals with a diameter of about 5 nm dispersed within the isolation insulating film. Note that the steps corresponding to FIGS. 10A and 10D are identical to those of the method according to the ninth embodiment and the first modification thereof, so that their description is omitted.

As described above, by implanting Si and Ge ions and then performing a thermal treatment, silicon germanium nanocrystals can be formed within the isolation insulating film. With the method of this modification, silicon germanium nanocrystals can be formed in any region of the isolation insulating film. Moreover, in the step corresponding to FIG. 10B, the amounts of Si ions and Ge ions to be implanted can be adjusted freely to control, as required, the silicon/germanium ratio of the contained silicon germanium nanocrystal to an arbitrary value.

In the method of this modification, the amounts of silicon and germanium to be added are set at 20% and 10% of the isolation insulating film, respectively. However, they are not limited to these values, and they can be selected according to a required amount of stress reduction. Also, the acceleration energies of Si ions and Ge ions are not limited to the values listed above, and it can be selected according to the depth of the trench.

In the step corresponding to FIG. 10B, implantation of Ge ions may be performed prior to the implantation of Si ions.

Tenth Embodiment

A fabrication method of the semiconductor device according to the second embodiment will be described as a tenth embodiment of the present invention.

FIGS. 11A to 11E are sectional views showing the method for fabricating a semiconductor device according to the tenth embodiment. This embodiment will describe process steps of forming a trench isolation structure.

Figure 11A:
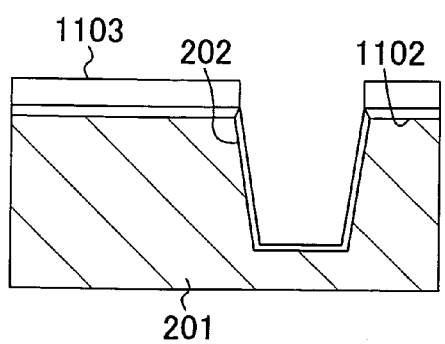
FIGS. 11A to 11E are sectional views showing a method for fabricating a semiconductor device according to a tenth embodiment.

In the step shown in FIG. 11A, first, a sacrificial oxide film 1102 and a mask nitride film 1103 are sequentially deposited on the silicon substrate 201. Photolithography and dry etching are then conducted to form a trench in the isolation region of the silicon substrate 201. The resulting silicon substrate 201 is subjected to a thermal treatment in an oxygen atmosphere at 1100° C. to round the corner of the trench and simultaneously form the side wall oxide film 202 having a thickness of 10 nm and covering the inner wall of the trench.

Subsequently, in the step shown in FIG. 11B, using a CVD method, a silicon oxide film 1105 containing silicon and having a thickness of 30 nm is deposited over the entire top surface of the substrate. In this step, for example, silane gas and oxygen gas both serving as a source gas are supplied into a reaction chamber on the condition of 0.1 Pa and 450° C. to deposit a silicon oxide film 1105 represented by $SiO_x$ (x=1.7) and containing silicon. In the as-deposited state, excess silicon atoms exist in the silicon oxide film in a dispersed state, and they are not crystallized.

Figure 11C:
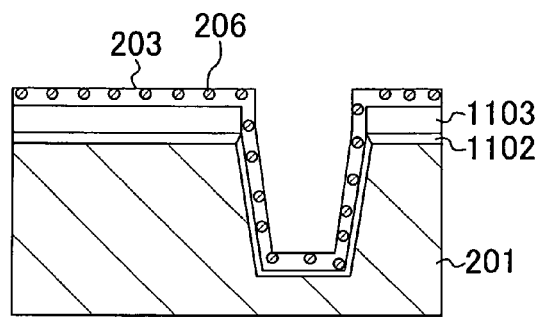

In the step shown in FIG. 11C, the resulting substrate is subjected to a thermal treatment in an inert gas such as argon gas at 1100° C. for 60 minutes. By this treatment, phase separation between silicon and silicon oxide occurs within the silicon oxide film 1105 deposited in the previous step, thereby forming the silicon nanocrystals 206 with a diameter of 5 nm. In this state, the silicon oxide film 1105 after phase separation has occurred is referred to as the liner layer 203. Since in this step, the thermal treatment is performed on the substrate with the silicon oxide film 1105 exposed, the composition can be controlled sharply and precisely. Furthermore, silicon diffusion to the outside of the silicon oxide film 1105 during the thermal treatment can be prevented.

Figure 11B:
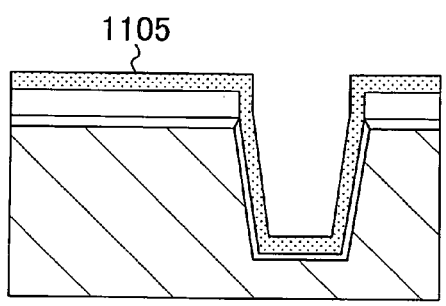
Figure 11D:
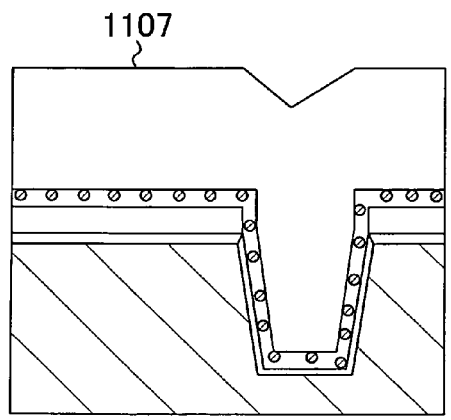

Next, in the step shown in FIG. 11D, a silicon oxide film 1107 with a thickness of 500 nm is deposited on the liner layer 203.

Figure 11E:
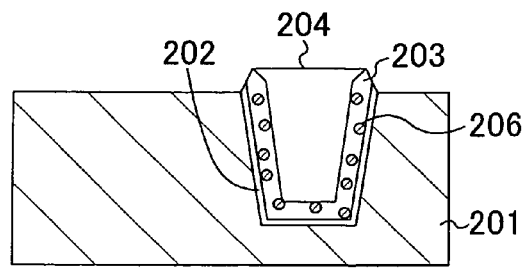

In the step shown in FIG 11E, first, using a CMP method, the silicon oxide film 1107 and the liner layer 203 are polished to expose the top surface of the mask nitride film 1103. Subsequently to this, the mask nitride film 1103 and the sacrificial oxide film 1102 are removed, whereby the liner layer 203 with the silicon nanocrystals 206 buried therewithin and the isolation insulating film 204 provided on the liner layer 203 can be formed in the trench.

In the method of the tenth embodiment, in the step shown in FIG. 11B, the amount of stress reduction on the active region of the silicon substrate 201 can be controlled by the silicon content. For example, as the content of silicon contained in the silicon oxide film increases, the diameter of the silicon nanocrystal 206 formed after the thermal treatment can be made greater. Also, the thickness of the liner layer 203 can be adjusted to control the amount of stress reduction.

In the fabrication method described above, the silicon nanocrystals 206 are formed within the liner layer 203 and then the silicon oxide film 1107 is deposited. However, the silicon nanocrystals 206 may be formed so that in the step shown in FIG. 11B, the silicon oxide film 1107 not containing silicon is formed on the silicon oxide film 1105 containing silicon and then a thermal treatment is performed.

In the method of the tenth embodiment, the x value of the $SiO_x$ film is set at 1.7, and the diameter of the silicon nanocrystal 206 is set at 5 nm. However, the diameter of the silicon nanocrystal 206 is not limited to this value, and its can be adjusted according to its application. Also, in this method, description has been made of the fabrication method in the case where the silicon nanocrystal is employed as the semiconductor nanocrystal. However, the material is not limited to silicon, and a germanium crystal or a silicon germanium nanocrystal may be employed thereas.

Eleventh Embodiment

A fabrication method of the semiconductor device according to the third embodiment shown in FIG. 3 will be described as an eleventh embodiment of the present invention.

FIGS. 12A to 12D are sectional views showing the method for fabricating a semiconductor device according to the eleventh embodiment. This embodiment will describe process steps of forming a trench isolation structure.

Figure 12A:
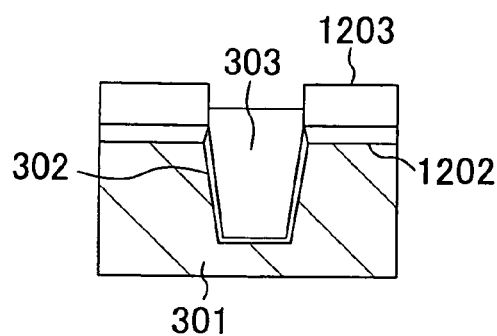
FIGS. 12A to 12D are sectional views showing a method for fabricating a semiconductor device according to an eleventh embodiment.

In the step shown in FIG. 12A, first, a sacrificial oxide film 1202 and a mask nitride film 1203 are sequentially deposited on the silicon substrate 301. Photolithography and dry etching are then conducted to form a trench in the isolation region of the silicon substrate 301. The resulting silicon substrate 301 is subjected to a thermal treatment in an oxygen atmosphere at 1100° C. to round the corner of the trench and simultaneously form the side wall oxide film 302 having a thickness of 10 nm and covering the inner wall of the trench. Subsequently, using a CVD method, a silicon oxide film filling the trench is formed over the entire top surface of the substrate. Using a CMP method, the silicon oxide film is then polished to expose the top surface of the mask nitride film 1203, thereby forming the isolation insulating film 303 of silicon oxide embedded in the trench. Thereafter, part of the isolation insulating film 303 is removed by wet etching to make the top surface of the isolation insulating film 303 lower in level than the top surface of the mask nitride film 1203.

Figure 12C:
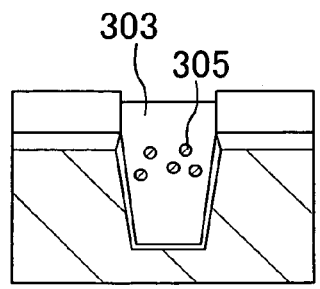
Figure 12B:
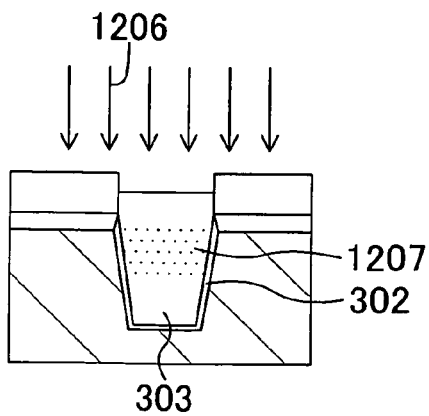

In the step shown in FIG. 12B, Si ions 1206 are implanted into a region of the isolation insulating film 303 to serve as an impurity diffusion layer of a semiconductor element (not shown) and a region thereof located more shallowly than this layer (for example, a region extending to a depth of 50 nm or smaller from the top surface of the silicon substrate 301). In this step, for example, the acceleration energy of Si ions is set at 50 keV. Thereby, the regions implanted with Si ions are formed to have a composition represented by $SiO_x$ (x=1.7).

Next, in the step shown in FIG. 12C, the resulting substrate is subjected to a thermal treatment in an inert gas such as argon gas at 1100° C. for 60 minutes. By this treatment, phase separation between silicon and silicon oxide occurs within the region implanted with Si ions in the previous step, thereby forming the silicon nanocrystals 305 with a diameter of about 5 nm dispersed in a region of the isolation insulating film 303 extending from the top surface of the silicon substrate 301 to a depth of about 50 nm or smaller.

Figure 12D:
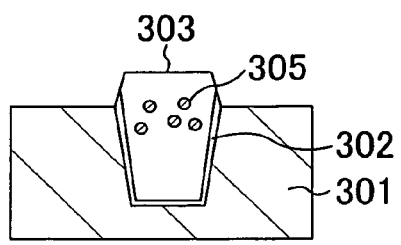

Next, in the step shown in FIG. 12D, the mask nitride film 1203 and the sacrificial oxide film 1202 are removed, whereby the isolation region of the semiconductor device of the third embodiment can be formed. Thereafter, by a commonly known method, a semiconductor element such as a MOS transistor is formed on the active region of the silicon substrate 301, thereby completing the semiconductor device of the third embodiment.

In the semiconductor device of the eleventh embodiment, Si ions are implanted into only part of the isolation insulating film, which improves throughput in the ion implantation process. Moreover, the semiconductor device has the structure in which only part of the isolation insulating film embedded in the trench contains silicon having a high dielectric constant, which suppresses degradation in isolation breakdown voltage.

In the method of the eleventh embodiment, the acceleration energy of Si ions is set at 50 keV and the x value of the $SiO_x$ film is set at 1.7. However, they are not limited to these values. Also, in this method, description has been made of the case where a silicon nanocrystal is employed as the semiconductor nanocrystal. Instead of the silicon nanocrystal, a group IV semiconductor crystal such as a germanium crystal or a silicon germanium crystal may be employed.

Twelfth Embodiment

A fabrication method of the semiconductor device according to the seventh embodiment shown in FIG. 7 will be described as a twelfth embodiment of the present invention.

FIGS. 13A to 13D are sectional views showing the method for fabricating a semiconductor device according to the twelfth embodiment. This embodiment will describe process steps of forming a trench isolation structure.

Figure 13A:
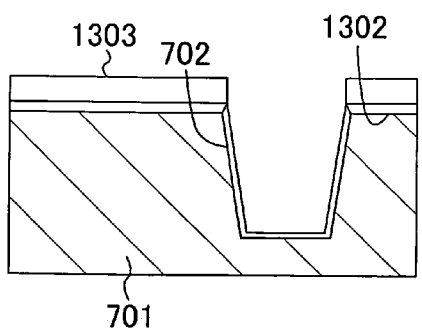
FIGS. 13A to 13D are sectional views showing a method for fabricating a semiconductor device according to a twelfth embodiment.

In the step shown in FIG. 13A, first, a sacrificial oxide film 1302 and a mask nitride film 1303 are sequentially deposited on the silicon substrate 701. Photolithography and dry etching are then conducted to form a trench in the isolation region of the silicon substrate 701. The resulting silicon substrate 701 is subjected to a thermal treatment in an oxygen atmosphere at 1100° C. to round the corner of the trench and simultaneously form the side wall oxide film 702 having a thickness of 10 nm and covering the inner wall of the trench.

Subsequently, in the step shown in FIG. 13B, using a CVD method, a silicon oxide film 1305 containing silicon and boron is deposited. In this step, about 1% of boron in the number of molecules is contained in the silicon oxide film 1305.

In this step, for example, silane gas, $B(OC_2H_5)_3$ gas, and oxygen gas all serving as a source gas are supplied into a reaction chamber on the condition of 0.1 Pa and 450° C. to deposit the silicon oxide film 1305 represented by $SiO_x$ (x=1.7) and containing silicon and boron. In the as-deposited state, excess silicon atoms exist in the silicon oxide film 1305 in a dispersed state, and they are not crystallized.

Figure 13C:
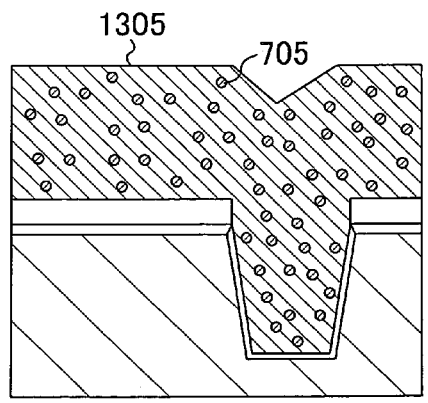

In the step shown in FIG. 13C, the resulting substrate is subjected to a thermal treatment in an inert gas such as argon gas at 1000° C. for 60 minutes. By this treatment, phase separation between silicon and silicon oxide occurs within the silicon oxide film 1305 deposited in the previous step, thereby forming the semiconductor nanocrystals 705 which are silicon crystals with a diameter of 5 nm. In this formation, since boron is contained in the silicon oxide film 1305, the crystallization temperature of silicon becomes lowered. Therefore, the semiconductor nanocrystals can be formed at a lower temperature.

Figure 13B:
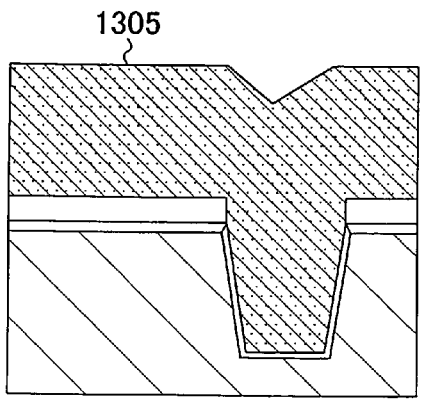
Figure 13D:
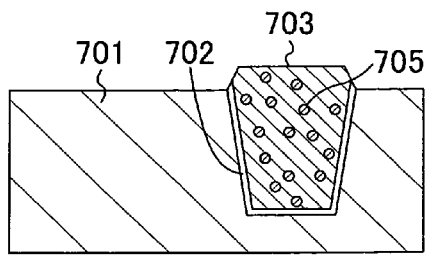

In the step shown in FIG. 13D, using a CMP method, the silicon oxide film 1305 is polished to expose the top surface of the mask nitride film 1303, and then the mask nitride film 1303 and the sacrificial oxide film 1302 are removed. In the manner described above, the semiconductor device according to the seventh embodiment can be fabricated.

In the method of the twelfth embodiment, the composition of the silicon oxide film 1305 deposited in the step shown in FIG. 13B is set to be $SiO_x$ (x=1.7) containing about 1% of boron. However, the composition of the silicon oxide film 1305 is not limited to this value, and it can be selected as appropriate according to a required amount of stress reduction.

Furthermore, a thermal treatment condition of 1000° C. and 60 minutes is shown in this embodiment. However, it is sufficient to employ the condition on which the semiconductor nanocrystals 705 can be formed, and the temperature and the thermal treatment time are not limited to these values. In the present invention, a silicon crystal is employed as the semiconductor nanocrystal, and boron is employed for the impurity. However, they are not limited to these. Alternatively, germanium or silicon germanium may be employed for the semiconductor nanocrystal, and phosphorus or both of boron and phosphorus may be employed as the impurity.

Thirteenth Embodiment

Description will be made of, as a thirteenth embodiment of the present invention, a fabrication method of a semiconductor device which includes an isolation insulating film containing an impurity such as boron and an isolation insulating film containing no impurity.

FIGS. 14A to 14E are sectional views showing the method for fabricating a semiconductor device according to the thirteenth embodiment. This embodiment will describe process steps of forming a trench isolation structure. In the views shown in FIGS. 14A to 14E, the isolation insulating film with an impurity such as boron introduced therewithin is shown on the left side, while the isolation insulating film with no impurity introduced therewithin is shown on the right side.

Figure 14A:
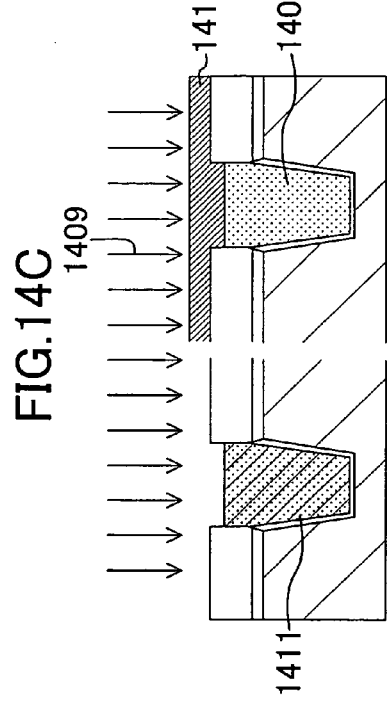
FIGS. 14A to 14E are sectional views showing a method for fabricating a semiconductor device according to a thirteenth embodiment.

In the step shown in FIG. 14A, first, a sacrificial oxide film 1402 and a mask nitride film 1403 are sequentially deposited on the silicon substrate 1401. Photolithography and dry etching are then conducted to form trenches in a first isolation region 1430 and a second isolation region 1432 of the silicon substrate 1401, respectively. The resulting silicon substrate 1401 is subjected to a thermal treatment in an oxygen atmosphere at 1100° C. to round the corners of the trenches and simultaneously form side wall oxide films 1418 and 1404 having a thickness of 10 nm and covering the inner walls of the trenches, respectively. Subsequently, using a CVD method, a silicon oxide film filling the trenches is formed over the entire top surface of the substrate. Then, using a CMP method, the silicon oxide film is polished to expose the top surface of the mask nitride film 1403, thereby forming isolation insulating films 1411 and 1408 of silicon oxide embedded in the trenches, respectively. Thereafter, portions of the isolation insulating films 1411 and 1408 are removed by wet etching so that the top surfaces of the isolation insulating films 1411 and 1408 are lower in level than the top surface of the mask nitride film 1403.

Figure 14B:
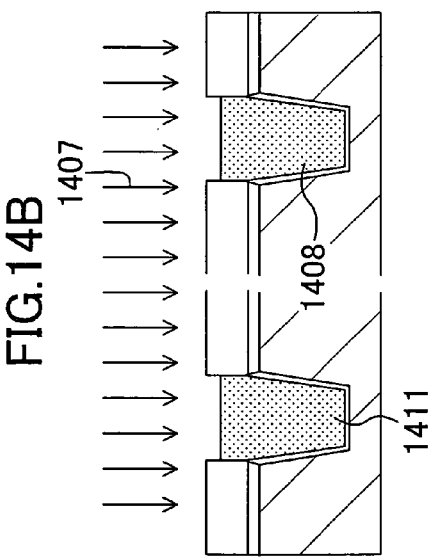

In the step shown in FIG. 14B, Si ions are implanted into the isolation insulating films 1411 and 1408. In this step, in order to form the entire isolation insulating films 1411 and 1408 having a composition represented by $SiO_x$ (x=1.7), Si ions 1407 are implanted in four steps consisting of acceleration energies of 25 keV, 50 keV, 100 keV, and 150 keV. By implanting Si ions 1407 on the condition shown above, the silicon concentration can be made almost uniform in regions of the isolation insulating films 1411 and 1408 extending from the top surface thereof to a depth of about 200 nm or smaller.

Figure 14C:
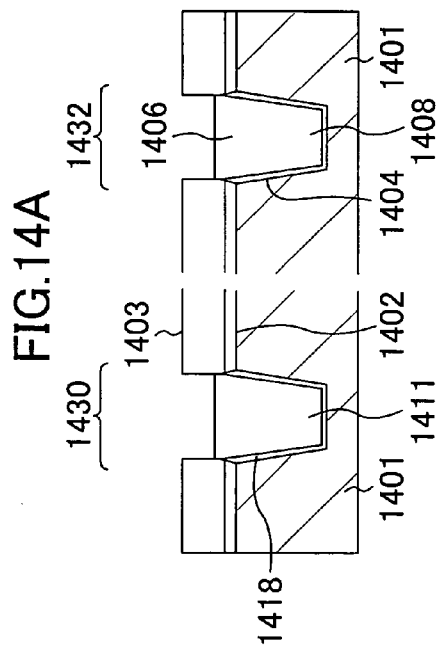

Subsequently, in the step shown in FIG. 14C, a photoresist 1410 is formed which covers the second isolation region 1432 and is formed with an opening located above the first isolation region 1430, and then boron ions 1409 are implanted into the isolation insulating film 1411. The first isolation region 1430 and the second isolation region 1432 can be arranged in any locations. For example, an exemplary case can also be employed where the first isolation region 1430 is arranged as a region surrounding an NMOS formation region and the second isolation region 1432 is arranged as a region surrounding a PMOS formation region. In this case, the photoresist 1410 covers the top of the PMOS formation region of the silicon substrate 1401, and exposes the NMOS formation region of the substrate. In this step, in order to form the isolation insulating film 1411 having a boron concentration of 1%, the boron ions 1409 are implanted into the isolation insulating film 1411 in four steps consisting of acceleration energies of 10 keV, 20 keV, 40 keV, and 60 keV.

Figure 14D:
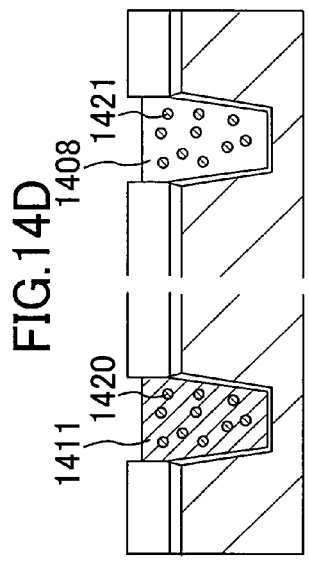

In the step shown in FIG. 14D, after removal of the photoresist 1410, the resulting substrate is subjected to a thermal treatment in an inert gas such as argon gas at 1100° C. for 60 minutes. By this treatment, phase separation between silicon and silicon oxide occurs within the isolation insulating films 1411 and 1408. As a result of this, semiconductor nanocrystals 1420 of a silicon crystal having a diameter of 7 nm are formed within the isolation insulating film 1411, while semiconductor nanocrystals 1421 of a silicon crystal having a diameter of 5 nm are formed within the isolation insulating film 1408. Since boron implantation improves the flowability of the isolation insulating film 1411, the semiconductor nanocrystals larger than those within the isolation insulating film 1408 are formed within the isolation insulating film 1411.

Figure 14E:
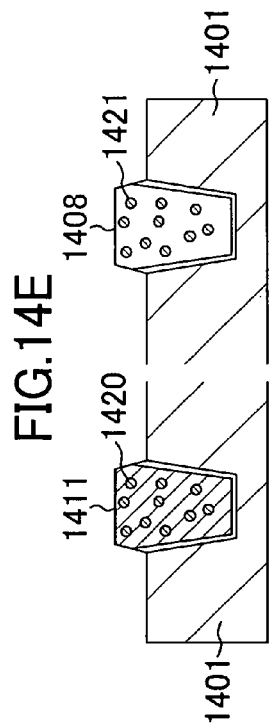
Figure 15A:
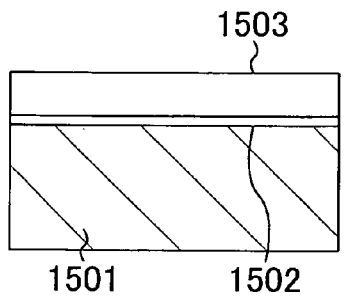
FIGS. 15A to 15F are sectional views showing a conventional STI formation flow.
Figure 15B:
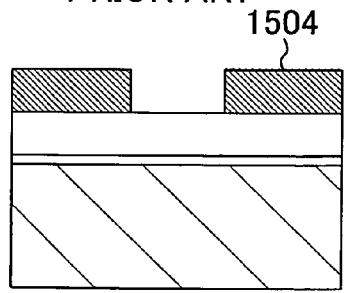
Figure 15C:
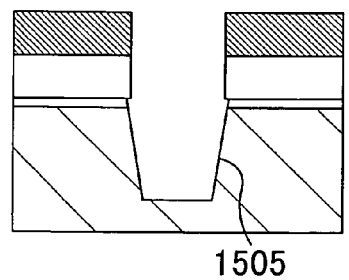
Figure 15D:
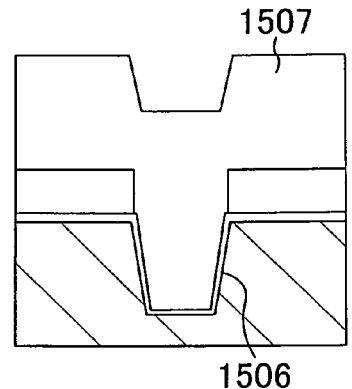
Figure 15E:
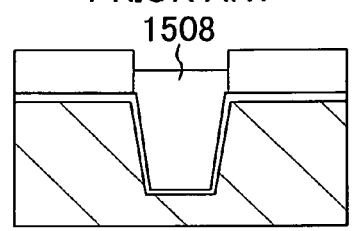
Figure 15F:
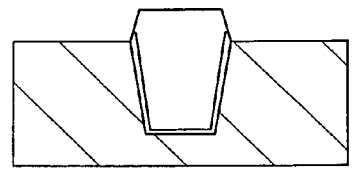
Figure 16A:
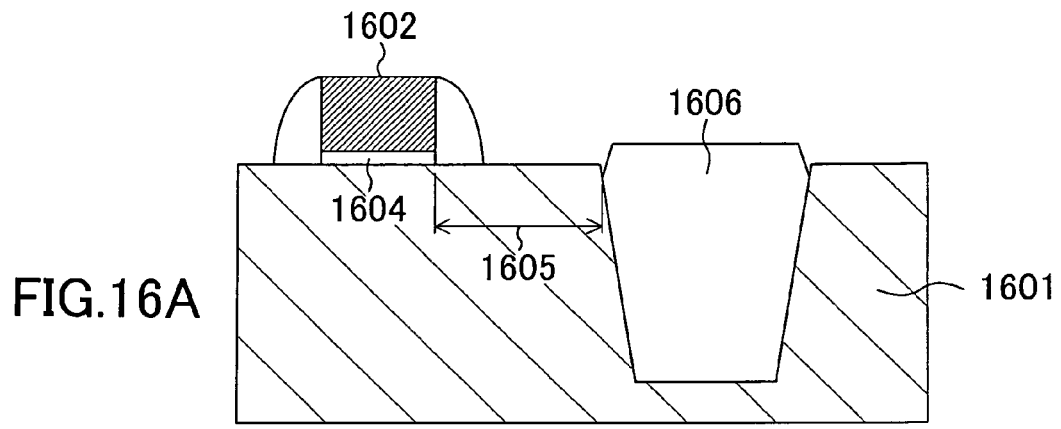
FIG. 16A is a schematic diagram showing cross-sectional structures of a MOS transistor and a STI portion.
Figure 16B:
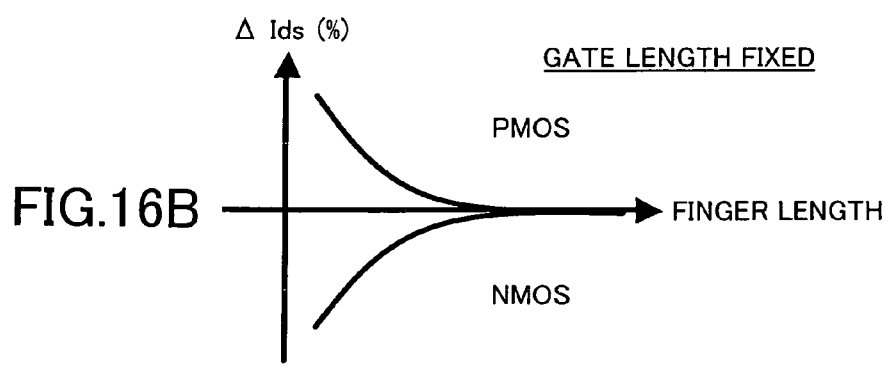
FIG. 16B is a graph schematically showing the relation between the variation rate of driving current and the finger length obtained from the MOS transistor with the gate electrode length fixed.
Figure 16C:
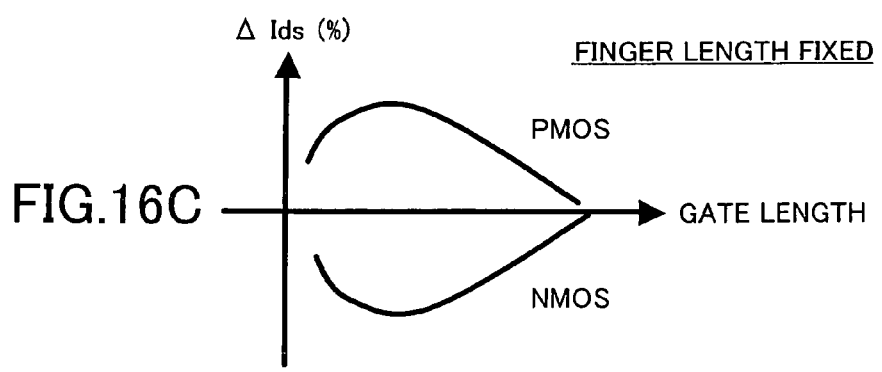
FIG. 16C is a graph schematically showing the relation between the variation rate of driving current and the gate length obtained from the MOS transistor with the finger length fixed.

Subsequently, in the step shown in FIG. 14E, the mask nitride film 1403 and the sacrificial oxide film 1402 are removed. Thereafter, by a commonly known method, an n-channel MOS transistor is formed on the NMOS formation region of the silicon substrate 1401, while a p-channel MOS transistor is formed on the PMOS formation region thereof. Thereby, a semiconductor device is fabricated which is provided with the isolation insulating films 1411 and 1408 with the semiconductor nanocrystals 1420 and 1421 buried therewithin, respectively.

As described above, the impurity and the semiconductor serving as the material for the semiconductor nanocrystal can be introduced by ion implantation into the isolation insulating film. Furthermore, by employing ion implantation, the impurity can be introduced selectively into only a portion of the isolation insulating film.

In the fabrication method of the thirteenth embodiment, the isolation insulating films 1411 and 1408 obtained after the Si ion implantation are set to have a composition represented by $SiO_x$ (x=1.7) and to have 1% of boron added into the isolation insulating film 1411. However, the composition and the amount of addition are not limited to these values, and they can be selected freely according to a required amount of stress reduction.

Furthermore, a thermal treatment condition of 1100° C. and 60 minutes are shown in this embodiment. However, it is sufficient to employ the condition on which semiconductor nanocrystals such as silicon nanocrystals can be formed, and the temperature and the thermal treatment time are not limited to these values.

In the method of the thirteenth embodiment, a silicon crystal is employed as the semiconductor nanocrystal, and boron is employed for the impurity introduced into the isolation insulating film. Alternatively, the semiconductor nanocrystal may consist of a germanium crystal or a silicon germanium crystal, and phosphorus or both of boron and phosphorus may be employed as the impurity.

As described above, with the semiconductor device and its fabrication method according to the present invention, generation of fixed charges is suppressed and stress applied from the isolation region to the channel region of the semiconductor element is reduced. Therefore, the present invention is useful in improving the operational reliability of various types of electronic equipment using transistors or the like.

What is claimed is:

1. A semiconductor device which comprises a first isolation region formed in a semiconductor substrate,
    wherein a first trench surrounding a first active region of the semiconductor substrate and a first insulating film embedded in the first trench are formed in the first isolation region, and
    the first insulating film contains semiconductor microparticles made of a group IV semiconductor crystal and at least either of a p-type impurity and an n-type impurity.

2. The device of claim 1,
    wherein the semiconductor microparticles are present only in a region of the first insulating film.

3. The device of claim 1,
    wherein the first insulating film comprises:
    a lower insulating film covering an inner wall of the first trench and containing the semiconductor microparticles; and
    an upper insulating film provided on the lower insulating film and filling the first trench.

4. The device of claim 1, further comprising an impurity diffusion layer formed in the first active region,
    wherein the first trench in the first isolation region is formed to have a greater depth from the surface of the semiconductor substrate than the impurity diffusion layer, and
    the semiconductor microparticles within the first insulating film are present in a region thereof located more shallowly than the deepest portion of the impurity diffusion layer in the depth direction from the surface of the semiconductor substrate.

5. The device of claim 1, further comprising, in the semiconductor substrate, a second isolation region in which a second trench surrounding a second active region of the semiconductor substrate and a second insulating film embedded in the second trench are formed,
    wherein the second insulating film does not contain the semiconductor microparticles.

6. The device of claim 5, further comprising:
    an n-channel MIS transistor formed on the first active region; and
    a p-channel MIS transistor formed on the second active region.

7. The device of claim 5, further comprising:
    a p-channel MIS transistor formed on the first active region; and
    an n-channel MIS transistor formed on the second active region.

8. The device of claim 6,
    wherein the n-channel MIS transistor has a finger length of 0.3 µm or smaller.

9. The device of claim 7,
    wherein the p-channel MIS transistor has a finger length of 0.4 µm or smaller.

10. The device of claim 1,
    wherein the semiconductor microparticles are made of one material selected from a silicon crystal, a germanium crystal, and a silicon germanium crystal.

11. The device of claim 1,
    wherein the semiconductor microparticles within the first insulating film are spaced 1.5 nm or more away from each other.

12. A semiconductor device which comprises a first isolation region formed in a semiconductor substrate, wherein a first trench surrounding a first active region of the semiconductor substrate and a first insulating film embedded in the first trench are formed in the first isolation region, the first insulating film contains semiconductor microparticles made of a group IV semiconductor crystal, the device further comprises an impurity diffusion layer formed in the first active region, wherein the first trench in the first isolation region is formed to have a greater depth from the surface of the semiconductor substrate than the impurity diffusion layer, and the semiconductor microparticles within the first insulating film are present in a region thereof located more shallowly than the deepest portion of the impurity diffusion layer in the depth direction from the surface of the semiconductor substrate.

13. A semiconductor device which comprises a first isolation region formed in a semiconductor substrate, wherein a first trench surrounding a first active region of the semiconductor substrate and a first insulating film embedded in the first trench are formed in the first isolation region, the first insulating film contains semiconductor microparticles made of a group IV semiconductor crystal, the device further comprises in the semiconductor substrate, a second isolation region in which a second trench surrounding a second active region of the semiconductor substrate and a second insulating film embedded in the second trench are formed, and wherein the second insulating film does not contain the semiconductor microparticles.

14. The device of claim 13, further comprising:

an n-channel MIS transistor formed on the first active region; and a p-channel MIS transistor formed on the second active region.

15. The device of claim 13, further comprising:

a p-channel MIS transistor formed on the first active region; and an n-channel MIS transistor formed on the second active region.

16. The device of claim 14, wherein the n-channel MIS transistor has a finger length of 0.3 µm or smaller.

17. The device of claim 15, wherein the p-channel MIS transistor has a finger length of 0.4 µm or smaller.

18. The device of claim 13, wherein the semiconductor microparticles are made of one material selected from a silicon crystal, a germanium crystal, and a silicon germanium crystal.

19. The device of claim 13, wherein the semiconductor microparticles within the first insulating film are spaced 1.5 nm or more away from each other.

* * * * *